US012643972B2

(12) United States Patent
Umehara et al.

(10) Patent No.: US 12,643,972 B2
(45) Date of Patent: Jun. 2, 2026

(54) RESIN COMPOSITION, PREPREG, FILM PROVIDED WITH RESIN, METAL FOIL PROVIDED WITH RESIN, METAL-CLAD LAMINATE, AND WIRING BOARD

(71) Applicant: PANASONIC INTELLECTUAL PROPERTY MANAGEMENT CO., LTD., Osaka (JP)

(72) Inventors: Hiroaki Umehara, Fukushima (JP); Hirosuke Saito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/025,289

(22) PCT Filed: Jan. 8, 2021

(86) PCT No.: PCT/JP2021/000507

§ 371 (c)(1),
(2) Date: Mar. 8, 2023

(87) PCT Pub. No.: WO2022/054303

PCT Pub. Date: Mar. 17, 2022

(65) Prior Publication Data

US 2023/0323000 A1 Oct. 12, 2023

(30) Foreign Application Priority Data

Sep. 11, 2020 (JP) ................................ 2020-153178

(51) Int. Cl.

| | |
|---|---|
| ***C08F 290/06*** | (2006.01) |
| ***C08J 5/24*** | (2006.01) |
| ***H05K 1/03*** | (2006.01) |

(52) U.S. Cl.

CPC ........... *C08F 290/062* (2013.01); *C08J 5/244* (2021.05); *H05K 1/0326* (2013.01); *H05K 1/0366* (2013.01); *C08J 2351/00* (2013.01); *C08J 2425/08* (2013.01)

(58) Field of Classification Search

CPC .................................................. C08F 290/062

See application file for complete search history.

(56) References Cited

U.S. PATENT DOCUMENTS

| | | | | |
|---|---|---|---|---|
| 4,689,378 | A * | 8/1987 | Chaudhari | C08F 16/02 526/259 |
| 5,399,715 | A | 3/1995 | Naitoh et al. | |
| 2007/0129502 | A1* | 6/2007 | Kawabe | C08L 53/00 525/391 |
| 2017/0029619 | A1* | 2/2017 | Lin | H05K 1/0373 |
| 2019/0367727 | A1* | 12/2019 | Liu | C08L 9/02 |
| 2021/0032404 | A1 | 2/2021 | Shigaki et al. | |
| 2023/0098357 | A1 | 3/2023 | Hirano et al. | |

FOREIGN PATENT DOCUMENTS

| | | | |
|---|---|---|---|
| JP | 2009-040934 | A | 2/2009 |
| JP | 2017206619 | A * | 11/2017 |
| WO | 93/012933 | A1 | 7/1993 |
| WO | 2005/073264 | A1 | 8/2005 |
| WO | 2019/138992 | A1 | 7/2019 |
| WO | WO-2020217675 | A1 * | 10/2020 |
| WO | 2021/149733 | A1 | 7/2021 |

OTHER PUBLICATIONS

ISR issued in International Patent Application No. PCT/JP2021/000507, Mar. 9, 2021, translation.

Safety Data Sheet for "JSR TR2250", prepared Jan. 30, 2007, Revised Oct. 8, 2020, partial translation.

* cited by examiner

*Primary Examiner* — Vickey Nerangis

(74) *Attorney, Agent, or Firm* — GREENBLUM & BERNSTEIN, P.L.C.

(57) ABSTRACT

A resin composition contains a polyphenylene ether compound having a carbon-carbon unsaturated double bond at the terminal, a maleimide compound (A) having an indane structure in the molecule, and an inorganic filler.

17 Claims, 5 Drawing Sheets

RESIN COMPOSITION, PREPREG, FILM PROVIDED WITH RESIN, METAL FOIL PROVIDED WITH RESIN, METAL-CLAD LAMINATE, AND WIRING BOARD

TECHNICAL FIELD

The present invention relates to a resin composition, a prepreg, a film with resin, a metal foil with resin, a metal-clad laminate, and a wiring board.

BACKGROUND ART

As the information processing quantity by various kinds of electronic equipment increases, mounting technologies such as high integration of semiconductor devices to be mounted, densification of wiring, and multilayering are progressing. In addition, wiring boards used in various kinds of electronic equipment are required to be, for example, high-frequency compatible wiring boards such as a millimeter-wave radar board for in-vehicle use. Substrate materials for forming insulating layers of wiring boards used in various kinds of electronic equipment are required to have a low relative dielectric constant and a low dielectric loss tangent in order to increase the signal transmission speed and to decrease the signal transmission loss.

It is known that polyphenylene ether exhibits excellent low dielectric properties such as a low relative dielectric constant and a low dielectric loss tangent and exhibits excellent low dielectric properties such as a low relative dielectric constant and a low dielectric loss tangent in a high frequency band (high frequency region) from the MHz band to the GHz band as well. For this reason, it has been investigated that polyphenylene ether is used, for example, as a high frequency molding material. More specifically, polyphenylene ether is preferably used as a substrate material for forming an insulating layer of a wiring board to be equipped in electronic equipment utilizing a high frequency band.

Substrate materials for forming insulating layers of wiring boards are also required not only to exhibit excellent low dielectric properties but also to exhibit enhanced curability so as to afford a cured product exhibiting excellent heat resistance and the like. Hence, it is conceivable that the heat resistance is enhanced by using a polyphenylene ether compound having a carbon-carbon unsaturated double bond at the terminal as a substrate material. As a resin composition containing such a polyphenylene ether compound having a carbon-carbon unsaturated double bond at the terminal, for example, the resin composition described in Patent Literature 1 may be mentioned.

Patent Literature 1 describes a resin composition containing a polymaleimide compound having a predetermined structure such as one having a 4,4'-biphenyl group in the molecule, modified polyphenylene ether of which the terminal is modified with a substituent containing a carbon-carbon unsaturated double bond, and a filler. According to Patent Literature 1, it is disclosed that it is possible to provide a resin composition that can simultaneously satisfy excellent peel strength, low water absorbing properties, desmear resistance, and heat resistance when used as a material for printed wiring board, or the like.

Metal-clad laminates and metal foils with resin used in the manufacture of wiring boards and the like include not only an insulating layer but also a metal foil on the insulating layer. Wiring boards also include not only an insulating layer but also wiring on the insulating layer. Examples of the wiring include wiring derived from a metal foil equipped in the metal-clad laminate or the like.

In recent years, particularly small portable devices such as mobile communication terminals and notebook PCs have been rapidly becoming multi-functional, high performance, slim and compact. Along with this, in wiring boards used in these products as well, there is a further demand for miniaturization of conductor wiring, multilayering of conductor wiring layers, thinning, and improvement in performance such as mechanical properties. In the case of such miniaturized wiring as well, in the wiring boards, it is required that the wiring does not peel off from the insulating layer and thus it is further required that adhesive properties between the wiring and the insulating layer are high. Hence, it is required that adhesive properties between the metal foil and the insulating layer are high in metal-clad laminates and metal foils with resin, and substrate materials for forming insulating layers of wiring boards are required to afford cured products exhibiting high adhesive properties to metal foils.

Wiring boards used in various kinds of electronic equipment are also required to be hardly affected by changes in the external environment. For example, substrate materials for forming insulating layers of wiring boards are required to afford cured products exhibiting low water absorbing properties so that the wiring boards can be used in a high humidity environment as well. It is considered that the insulating layers of wiring boards obtained from such substrate materials that afford cured products exhibiting low water absorbing properties can suppress moisture absorption. Since wiring boards may be exposed to high temperature environments for reflow during board processing such as mounting of semiconductor chips, substrate materials for forming wiring boards are required to exhibit high heat resistance such as a high glass transition temperature.

Furthermore, in order to suppress loss due to increased resistance accompanying miniaturization of wiring, the insulating layers equipped in wiring boards are further required to have a low relative dielectric constant and a low dielectric loss tangent.

CITATION LIST

Patent Literature

Patent Literature 1: WO 2019/138992 A

SUMMARY OF INVENTION

The present invention has been made in view of such circumstances, and an object thereof is to provide a resin composition, which affords a cured product exhibiting excellent low dielectric properties, heat resistance, and adhesive properties to a metal foil and a low water absorption. Another object of the present invention is to provide a prepreg, a film with resin, a metal foil with resin, a metal-clad laminate, and a wiring board, which are obtained using the resin composition.

An aspect of the present invention is a resin composition containing a polyphenylene ether compound having a carbon-carbon unsaturated double bond at the terminal, a maleimide compound (A) having an indane structure in the molecule, and an inorganic filler.

DESCRIPTION OF EMBODIMENTS

Figure 1:
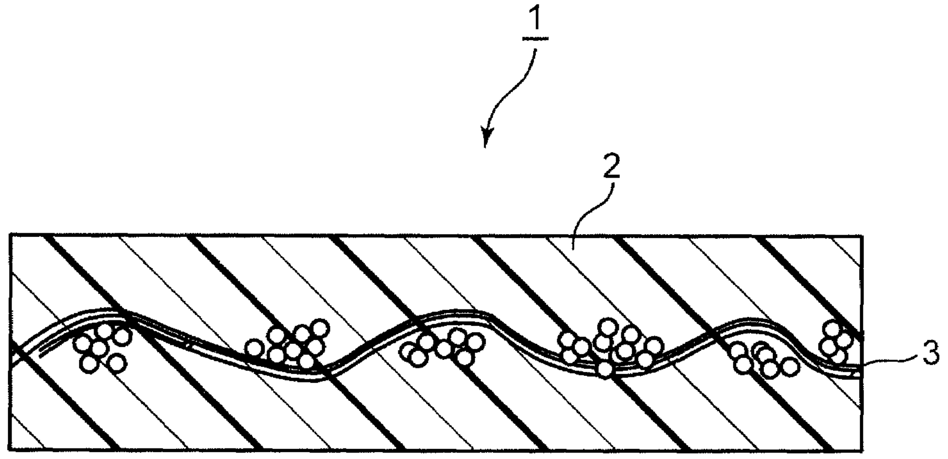
FIG. 1 is a schematic sectional view illustrating an example of a prepreg according to an embodiment of the present invention.

The present inventors have found out that the objects are achieved by the present invention described below as a result of extensive studies.

Hereinafter, embodiments according to the present invention will be described, but the present invention is not limited thereto.

[Resin Composition]

The resin composition according to the present embodiment is a resin composition containing a polyphenylene ether compound having a carbon-carbon unsaturated double bond at the terminal, a maleimide compound (A) having an indane structure in the molecule, and an inorganic filler. By curing the resin composition having such a configuration, a cured product is obtained which exhibits excellent low dielectric properties, heat resistance, and adhesive properties to a metal foil and a low water absorption.

First, the resin composition can maintain the excellent low dielectric properties of polyphenylene ether as the resin composition can be suitably cured by curing the polyphenylene ether compound together with the maleimide compound (A). It is considered that a cured product exhibiting high heat resistance is obtained as the resin composition contains an inorganic filler. According to the resin composition, it is considered that it is possible to decrease the water absorbing properties and increase the adhesive properties to a metal foil of the cured product obtained by curing the polyphenylene ether compound together with the maleimide compound (A). From these facts, it is considered that the resin composition affords a cured product, which exhibits excellent low dielectric properties, heat resistance, and adhesive properties to a metal foil and a low water absorption.

(Polyphenylene Ether Compound)

The polyphenylene ether compound is not particularly limited as long as it is a polyphenylene ether compound having a carbon-carbon unsaturated double bond at the terminal. Examples of the polyphenylene ether compound include a polyphenylene ether compound having a carbon-carbon unsaturated double bond at the molecular terminal, and more specific examples thereof include a polyphenylene ether compound having a substituent having a carbon-carbon unsaturated double bond at the molecular terminal such as a modified polyphenylene ether compound of which the terminal is modified with a substituent having a carbon-carbon unsaturated double bond.

Examples of the substituent having a carbon-carbon unsaturated double bond include a group represented by the following Formula (3) and a group represented by the following Formula (4). In other words, examples of the polyphenylene ether compound include a polyphenylene ether compound having at least one selected from a group represented by the following Formula (3) and a group represented by the following Formula (4) at the molecular terminal.

[Chem. 1]

(3)

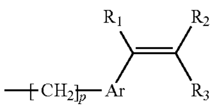

In Formula (3), $R_1$ to $R_3$ are independent of each other. In other words, $R_1$ to $R_3$ may be the same group as or different groups from each other. $R_1$ to $R_3$ represent a hydrogen atom or an alkyl group. Ar represents an arylene group. p represents 0 to 10. In a case where p in Formula (3) is 0, it indicates that Ar is directly bonded to the terminal of polyphenylene ether.

The arylene group is not particularly limited. Examples of this arylene group include a monocyclic aromatic group such as a phenylene group and a polycyclic aromatic group that is polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

[Chem. 2]

(4)

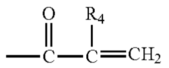

In Formula (4), $R_4$ represents a hydrogen atom or an alkyl group. The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

Examples of the group represented by Formula (3) include a vinylbenzyl group (ethenylbenzyl group) represented by the following Formula (5). Examples of the group represented by Formula (4) include an acryloyl group and a methacryloyl group.

[Chem. 3]

(5)

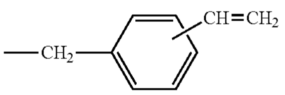

More specific examples of the substituent include vinylbenzyl groups (ethenylbenzyl groups) such as an o-ethenylbenzyl group, a m-ethenylbenzyl group, and a p-ethenylbenzyl group, a vinylphenyl group, an acryloyl group, and a methacryloyl group. The polyphenylene ether compound may have one kind of substituent or two or more kinds of substituents as the substituent. The polyphenylene ether compound may have, for example, any of an o-ethenylbenzyl group, a m-ethenylbenzyl group, or a p-ethenylbenzyl group, or two or three kinds thereof.

The polyphenylene ether compound has a polyphenylene ether chain in the molecule and preferably has, for example, a repeating unit represented by the following Formula (6) in the molecule.

[Chem. 4]

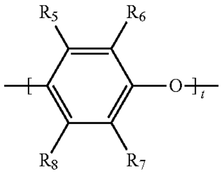

(6)

In Formula (6), t represents 1 to 50. $R_5$ to $R_8$ are independent of each other. In other words, $R_5$ to $R_8$ may be the same group as or different groups from each other. $R_5$ to $R_8$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in $R_5$ to $R_8$ include the following.

The alkyl group is not particularly limited but is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

The alkenyl group is not particularly limited but is, for example, preferably an alkenyl group having 2 to 18 carbon atoms, more preferably an alkenyl group having 2 to 10 carbon atoms. Specific examples thereof include a vinyl group, an allyl group, and a 3-butenyl group.

The alkynyl group is not particularly limited but is, for example, preferably an alkynyl group having 2 to 18 carbon atoms, more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group but is, for example, preferably an alkylcarbonyl group having 2 to 18 carbon atoms, more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group but is, for example, preferably an alkenylcarbonyl group having 3 to 18 carbon atoms, more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group but is, for example, preferably an alkynylcarbonyl group having 3 to 18 carbon atoms, more preferably an alkynylcarbonyl group having 3 to 10 carbon atoms. Specific examples thereof include a propioloyl group.

The weight average molecular weight (Mw) and number average molecular weight (Mn) of the polyphenylene ether compound are not particularly limited, and specifically, are preferably 500 to 5,000, more preferably 800 to 4,000, still more preferably 1,000 to 3,000. Here, the weight average molecular weight and number average molecular weight may be those measured by general molecular weight measurement methods, and specific examples thereof include values measured by gel permeation chromatography (GPC). In a case where the polyphenylene ether compound has a repeating unit represented by Formula (6) in the molecule, t is preferably a numerical value so that the weight average molecular weight and number average molecular weight of the polyphenylene ether compound is in such a range. Specifically, t is preferably 1 to 50.

When the weight average molecular weight and number average molecular weight of the polyphenylene ether compound are in the above range, the excellent low dielectric properties of polyphenylene ether are exhibited, and not only the heat resistance of the cured product is superior but also the moldability is excellent. This is considered to be due to the following. When the weight average molecular weight and number average molecular weight of ordinary polyphenylene ether are in the above range, the molecular weight is relatively low, and thus the heat resistance tends to decrease. With regard to this point, it is considered that since the polyphenylene ether compound according to the present embodiment has one or more unsaturated double bonds at the terminal, a cured product exhibiting sufficiently high heat resistance is obtained as the curing reaction proceeds. When the weight average molecular weight and number average molecular weight of the polyphenylene ether compound are in the above range, it is considered that the molecular weight is relatively low and thus the moldability is also excellent. Hence, it is considered that such a polyphenylene ether compound not only imparts superior heat resistance to the cured product but also exhibits excellent moldability.

In the polyphenylene ether compound, the average number of the substituents (number of terminal functional groups) at the molecule terminal per one molecule of the polyphenylene ether compound is not particularly limited. Specifically, the average number is preferably 1 to 5, more preferably 1 to 3, and still more preferably 1.5 to 3. When the number of terminal functional groups is too small, sufficient heat resistance of the cured product tends to be hardly attained. When the number of terminal functional groups is too large, the reactivity is too high and, for example, troubles such as deterioration in the storage stability of the resin composition or deterioration in the fluidity of the resin composition may occur. In other words, when such a polyphenylene ether compound is used, for example, molding defects such as generation of voids at the time of multilayer molding occur by insufficient fluidity and the like and a problem of moldability that a highly reliable printed wiring board is hardly obtained may occur.

The number of terminal functional groups in the polyphenylene ether compound includes a numerical value expressing the average value of the substituents per one molecule of all the polyphenylene ether compounds present in 1 mole of the polyphenylene ether compound. This number of terminal functional groups can be determined by, for example, measuring the number of hydroxyl groups remaining in the obtained polyphenylene ether compound and calculating the number of hydroxyl groups decreased from the number of hydroxyl groups in the polyphenylene ether before having (before being modified with) the substituent. The number of hydroxyl groups decreased from the number of hydroxyl groups in the polyphenylene ether before being modified is the number of terminal functional groups. Moreover, with regard to the method for measuring the number of hydroxyl groups remaining in the polyphenylene ether compound, the number of hydroxyl groups can be determined by adding a quaternary ammonium salt (tetraethylammonium hydroxide) to be associated with a hydroxyl group to a solution of the polyphenylene ether compound and measuring the UV absorbance of the mixed solution.

The intrinsic viscosity of the polyphenylene ether compound is not particularly limited. Specifically, the intrinsic viscosity may be 0.03 to 0.12 dl/g, and is preferably 0.04 to 0.11 dl/g and more preferably 0.06 to 0.095 dl/g. When this intrinsic viscosity is too low, the molecular weight tends to be low and low dielectric properties such as a low relative dielectric constant and a low dielectric loss tangent tend to be hardly attained. When the intrinsic viscosity is too high, the viscosity is high, sufficient fluidity is not attained, and the moldability of the cured product tends to decrease. Hence, when the intrinsic viscosity of the polyphenylene ether compound is in the above range, excellent heat resistance and moldability of the cured product can be realized.

Note that the intrinsic viscosity here is an intrinsic viscosity measured in methylene chloride at 25° C. and more specifically is, for example, a value attained by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

Examples of the polyphenylene ether compound include a polyphenylene ether compound represented by the following Formula (7) and a polyphenylene ether compound represented by the following Formula (8). As the polyphenylene ether compound, these polyphenylene ether compounds may be used singly or these two kinds of polyphenylene ether compounds may be used in combination.

[Chem. 5]

(7)

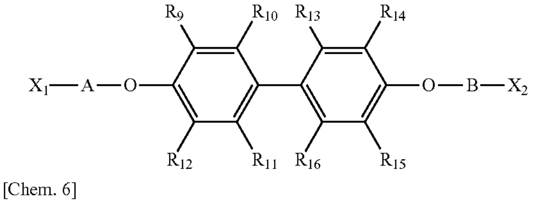

[Chem. 6]

(8)

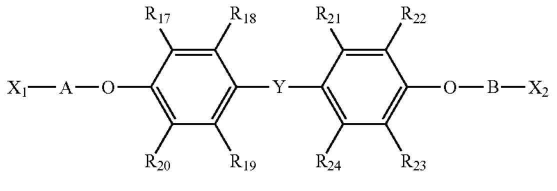

In Formulas (7) and (8), $R_9$ to $R_{16}$ and $R_{17}$ to $R_{24}$ each independently represent a hydrogen atom, an alkyl group, an alkenyl group, an alkynyl group, a formyl group, an alkylcarbonyl group, an alkenylcarbonyl group, or an alkynylcarbonyl group. $X_1$ and $X_2$ each independently represent a substituent having a carbon-carbon unsaturated double bond. A and B represent a repeating unit represented by the following Formula (9) and a repeating unit represented by the following Formula (10), respectively. In Formula (8), Y represents a linear, branched, or cyclic hydrocarbon having 20 or less carbon atoms.

[Chem. 7]

(9)

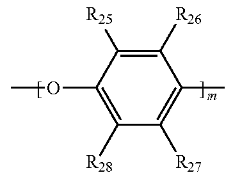

[Chem. 8]

(10)

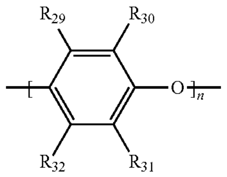

In Formulas (9) and (10), m and n each represent 0 to 20. $R_{25}$ to $R_{28}$ and $R_{29}$ to $R_{32}$ each independently represent a hydrogen atom, an alkyl group, an alkenyl group, an alkynyl group, a formyl group, an alkylcarbonyl group, an alkenylcarbonyl group, or an alkynylcarbonyl group.

The polyphenylene ether compound represented by Formula (7) and the polyphenylene ether compound represented by Formula (8) are not particularly limited as long as they are compounds satisfying the configuration. Specifically, in Formulas (7) and (8), $R_9$ to $R_{16}$ and $R_{17}$ to $R_{24}$ are independent of each other as described above. In other words, $R_9$ to $R_{16}$ and Ru to $R_{24}$ may be the same group as or different groups from each other. $R_9$ to $R_{16}$ and $R_{17}$ to $R_{24}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

In Formulas (9) and (10), m and n each preferably represent 0 to 20 as described above. In addition, it is preferable that m and n represent numerical values so that the sum of m and n is 1 to 30. Hence, it is more preferable that m represents 0 to 20, n represents 0 to 20, and the sum of m and n represents 1 to 30. $R_{25}$ to $R_{28}$ and $R_{29}$ to $R_{32}$ are independent of each other. In other words, $R_{25}$ to $R_{28}$ and $R_{29}$ to $R_{32}$ may be the same group as or different groups from each other. $R_{25}$ to $R_{28}$ and $R_{29}$ to $R_{32}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

$R_9$ to $R_{32}$ are the same as $R_5$ to $R_8$ in Formula (6).

In Formula (8), Y represents a linear, branched, or cyclic hydrocarbon having 20 or less carbon atoms as described above. Examples of Y include a group represented by the following Formula (11).

[Chem. 9]

(11)

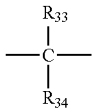

In Formula (11), $R_{33}$ and $R_{34}$ each independently represent a hydrogen atom or an alkyl group. Examples of the alkyl group include a methyl group. Examples of the group represented by Formula (11) include a methylene group, a methylmethylene group, and a dimethylmethylene group. Among these, a dimethylmethylene group is preferable.

In Formulas (7) and (8), $X_1$ and $X_2$ each independently represent a substituent having a carbon-carbon double bond. In the polyphenylene ether compound represented by Formula (7) and the polyphenylene ether compound represented by Formula (8), $X_1$ and $X_2$ may be the same group as or different groups from each other.

More specific examples of the polyphenylene ether compound represented by Formula (7) include a polyphenylene ether compound represented by the following Formula (12).

[Chem. 10]

(12)

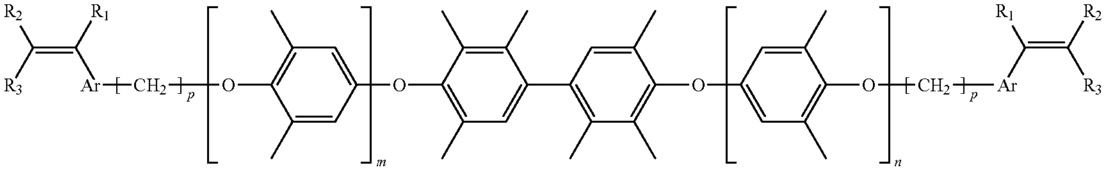

More specific examples of the polyphenylene ether compound represented by Formula (8) include a polyphenylene ether compound represented by the following Formula (13) and a polyphenylene ether compound represented by the following Formula (14).

[Chem. 11]

(13)

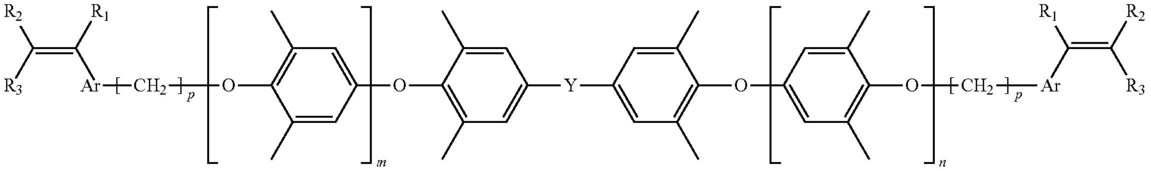

[Chem. 12]

(14)

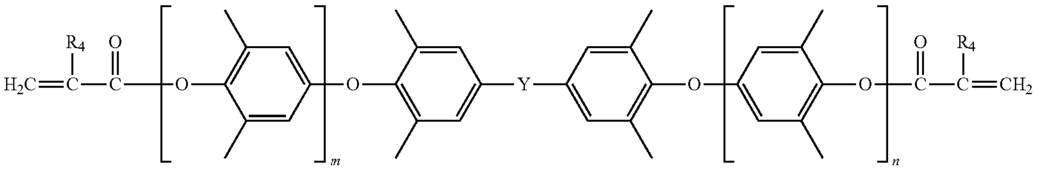

In Formulas (12) to (14), m and n are the same as m and n in Formulas (9) and (10). In Formulas (12) and (13), $R_1$ to $R_3$, p, and Ar are the same as $R_1$ to $R_3$, p, and Ar in Formula (3). In Formulas (13) and (14), Y is the same as Yin Formula (8). In Formula (14), $R_4$ is the same as $R_4$ in Formula (4).

The method for synthesizing the polyphenylene ether compound used in the present embodiment is not particularly limited as long as a polyphenylene ether compound having a carbon-carbon unsaturated double bond at the terminal can be synthesized. Specific examples of this method include a method in which polyphenylene ether is reacted with a compound in which a substituent having a carbon-carbon unsaturated double bond is bonded to a halogen atom.

Examples of the compound in which a substituent having a carbon-carbon unsaturated double bond is bonded to a halogen atom include compounds in which substituents represented by Formulas (3) to (5) are bonded to a halogen atom. Specific examples of the halogen atom include a chlorine atom, a bromine atom, an iodine atom, and a fluorine atom. Among these, a chlorine atom is preferable. More specific examples of the compound in which a substituent having a carbon-carbon unsaturated double bond is bonded to a halogen atom include o-chloromethylstyrene, p-chloromethylstyrene, and m-chloromethylstyrene. The compound in which a substituent having a carbon-carbon unsaturated double bond is bonded to a halogen atom may be used singly or in combination of two or more kinds thereof. For example, o-chloromethylstyrene, p-chloromethylstyrene, and m-chloromethylstyrene may be used singly or in combination of two or three kinds thereof.

Polyphenylene ether that is a raw material is not particularly limited as long as a predetermined polyphenylene ether compound can be finally synthesized. Specific examples thereof include those containing polyphenylene ether containing 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule.

Examples of the method for synthesizing the polyphenylene ether compound include the methods described above. Specifically, polyphenylene ether as described above and the compound in which a substituent having a carbon-carbon unsaturated double bond is bonded to a halogen atom are dissolved in a solvent and stirred. By doing so, polyphenylene ether reacts with the compound in which a substituent having a carbon-carbon unsaturated double bond is bonded to a halogen atom, and the polyphenylene ether compound used in the present embodiment is obtained.

The reaction is preferably conducted in the presence of an alkali metal hydroxide. By doing so, it is considered that this reaction suitably proceeds. This is considered to be because the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which a substituent having a carbon-carbon unsaturated double bond is bonded to a halogen atom, and by doing so, the substituent having a carbon-carbon unsaturated double bond is bonded to the oxygen atom of the phenol group instead of the hydrogen atom of the phenol group in polyphenylene ether.

The alkali metal hydroxide is not particularly limited as long as it can act as a dehalogenating agent, and examples thereof include sodium hydroxide. The alkali metal hydroxide is usually used in the form of an aqueous solution, and specifically, is used as an aqueous sodium hydroxide solution.

The reaction conditions such as reaction time and reaction temperature also vary depending on the compound in which a substituent having a carbon-carbon unsaturated double bond is bonded to a halogen atom, and the like, and are not particularly limited as long as they are conditions under which the reaction as described above suitably proceeds. Specifically, the reaction temperature is preferably room temperature to 100° C. and more preferably 30° C. to 100° C. In addition, the reaction time is preferably 0.5 to 20 hours and more preferably 0.5 to 10 hours.

The solvent used at the time of the reaction is not particularly limited as long as it can dissolve polyphenylene ether and the compound in which a substituent having a carbon-carbon unsaturated double bond is bonded to a halogen atom, and does not inhibit the reaction of polyphenylene ether with the compound in which a substituent having a carbon-carbon unsaturated double bond is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. By doing so, it is considered that the above reaction more suitably proceeds. This is considered to be due to the following. This is considered to be because the phase transfer catalyst is a catalyst which has a function of taking in the alkali metal hydroxide, is soluble in both phases of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that when the aqueous sodium hydroxide solution is dropped into the solvent subjected to the reaction as well, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, but examples thereof include quaternary ammonium salts such as tetra-n-butylammonium bromide.

The resin composition used in the present embodiment preferably contains a polyphenylene ether compound obtained as described above as the polyphenylene ether compound.

(Maleimide Compound (A))

The maleimide compound (A) is not particularly limited as long as it is a maleimide compound having an indane structure in the molecule. Examples of the indane structure include a divalent group obtained by eliminating two hydrogen atoms from indane or indane substituted with a substituent, and more specific examples thereof include a structure represented by the following Formula (1). The maleimide compound (A) also has a maleimide group in the molecule. Examples of the maleimide compound (A) include a maleimide compound having a structure represented by the following Formula (1) in the molecule, and more specific examples thereof include a maleimide compound (A1) having a structure represented by the following Formula (2) in the molecule.

[Chem. 13]

(1)

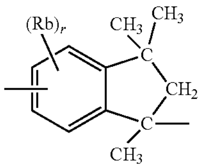

In Formula (1), "Rb"s are independent of each other. In other words, "Rb"s may be the same group as or different groups from each other, and for example, when r is 2 or 3, two or three "Rb"s bonded to the same benzene ring may be the same group as or different groups from each other. "Rb" represents an alkyl group having 1 to 10 carbon atoms, an alkyloxy group (alkoxy group) having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a hydroxyl group, or a mercapto group (thiol group). r represents 0 to 3.

[Chem. 14]

(2)

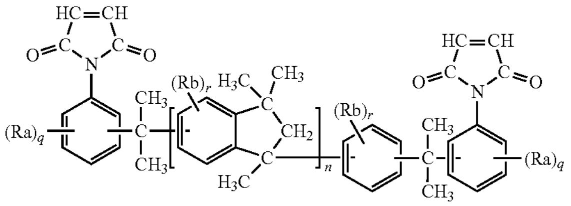

In Formula (2), "Ra"s are independent of each other. In other words, "Ra"s may be the same group as or different groups from each other, and for example, when q is 2 to 4, two to four "Ra"s bonded to the same benzene ring may be the same group as or different groups from each other. "Ra" represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group. "Rb" is the same as "Rb" in Formula (1), and "Rb"s each independently represent an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group. q represents 0 to 4. r represents 0 to 3. n represents 0.95 to 10.

r is the average value of the degree of substitution of "Rb", it is more preferable as r is smaller, and specifically, r is preferably 0. In other words, in the benzene ring to which "Rb" may be bonded, it is preferable that a hydrogen atom is bonded to the position to which "Rb" may be bonded. It is easy to synthesize the maleimide compound (A) having such r. It is considered that this is because steric hindrance is diminished and the electron density in the aromatic ring increases. When r is 1 to 3, "Rb" is preferably at least one selected from the group consisting of an alkyl group having 1 to 4 carbon atoms, a cycloalkyl group having 3 to 6 carbon atoms, and an aryl group having 6 to 10 carbon atoms among the above. "Ra" is preferably at least one selected from the group consisting of an alkyl group having 1 to 4 carbon atoms, a cycloalkyl group having 3 to 6 carbon atoms, and an aryl group having 6 to 10 carbon atoms among the above. As "Ra" and "Rb" are an alkyl group having 1 to 4 carbon atoms, a cycloalkyl group having 3 to 6 carbon atoms, or an aryl group having 6 to 10 carbon atoms, it is easy to dissolve the maleimide compound (A) in a solvent as well as a decrease in reactivity of the maleimide group can be suppressed and a suitable cured product is obtained. It is considered that this is due to a decrease in planarity in the vicinity of the maleimide group, a decrease in crystallinity, and the like.

Specific examples of the groups represented by “Ra” and “Rb” include the following groups.

The alkyl group having 1 to 10 carbon atoms is not particularly limited, and examples thereof include a methyl group, an ethyl group, a propyl group, a hexyl group and a decyl group.

The alkyloxy group having 1 to 10 carbon atoms is not particularly limited, and examples thereof include a methyloxy group, an ethyloxy group, a propyloxy group, a hexyloxy group and a decyloxy group.

The alkylthio group having 1 to 10 carbon atoms is not particularly limited, and examples thereof include a methylthio group, an ethylthio group, a propylthio group, a hexylthio group and a decylthio group.

The aryl group having 6 to 10 carbon atoms is not particularly limited, and examples thereof include a phenyl group and a naphthyl group.

The aryloxy group having 6 to 10 carbon atoms is not particularly limited, and examples thereof include a phenyloxy group and a naphthyloxy group.

The arylthio group having 6 to 10 carbon atoms is not particularly limited, and examples thereof include a phenylthio group and a naphthylthio group.

The cycloalkyl group having 3 to 10 carbon atoms is not particularly limited, and examples thereof include a cyclopropyl group, a cyclobutyl group, a cyclohexyl group, and a cyclooctyl group.

Examples of the halogen atom include a fluorine atom, a chlorine atom, a bromine atom, and an iodine atom.

q is the average value of the degree of substitution of “Ra”, and is preferably 2 to 3, more preferably 2. It is easy to synthesize the maleimide compound (A) having such q. It is considered that this is because steric hindrance is diminished and the electron density in the aromatic ring increases particularly when q is 2.

n is the average value of the number of repetitions, and is 0.95 to 10 as described above, preferably 0.98 to 8, more preferably 1 to 7, still more preferably 1.1 to 6. The content of the maleimide compound, which is a maleimide compound represented by Formula (1) and a maleimide compound (A1) represented by Formula (2) and in which n that is the average value of the number of repetitions (degree of polymerization) is 0, is preferably 32% by mass or less with respect to the total amount of the maleimide compound (A).

The molecular weight distribution (Mw/Mn) of the maleimide compound (A) acquired by GPC measurement is preferably 1 to 4, more preferably 1.1 to 3.8, still more preferably 1.2 to 3.6, particularly preferably 1.3 to 3.4. The molecular weight distribution is acquired by gel permeation chromatography (GPC) measurement.

It is preferable that the maleimide compound (A) further has an arylene structure bonded in the meta-orientation in the molecule. Examples of the arylene structure bonded in the meta-orientation include an arylene structure (an arylene structure in which a structure containing a maleimide group is substituted at the meta position) in which a structure containing a maleimide group (that is, other than “Rb”) is bonded to the meta position. The arylene structure bonded in the meta-orientation is an arylene group bonded in the meta-orientation, such as a group represented by the following Formula (15). Examples of the arylene structure bonded in the meta-orientation include m-arylene groups such as a m-phenylene group and a m-naphthylene group, and more specific examples thereof include a group represented by the following Formula (15).

[Chem. 15]

(15)

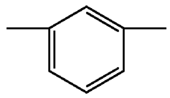

Specific examples of the maleimide compound (A) include maleimide compounds represented by Formulas (16) to (18). These maleimide compounds (A) further have an arylene group bonded in the meta-orientation, such as a group represented by the following Formula (15), in the molecule.

[Chem. 16]

(16)

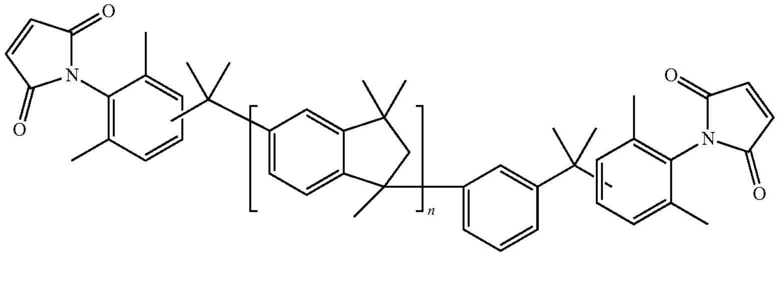

In Formula (16), n represents 0.95 to 10.

[Chem. 17]

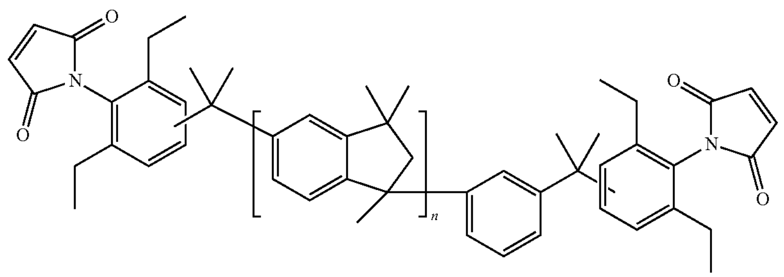

(17)

In Formula (17), n represents 0.95 to 10.

[Chem. 18]

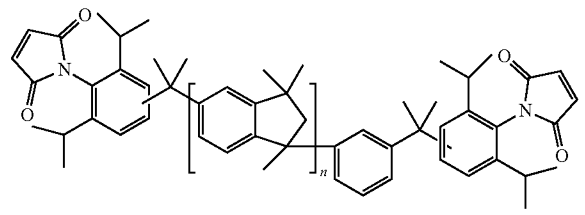

(18)

In Formula (18), n represents 0.95 to 10.

The method for producing the maleimide compound (A) is not particularly limited as long as the maleimide compound (A) can be produced. Specifically, the maleimide compound (A) is obtained by a so-called maleimidation reaction in which an amine compound represented by the following Formula (19) is reacted with maleic anhydride in an organic solvent such as toluene in the presence of a catalyst such as toluenesulfonic acid. More specifically, after the maleimidation reaction, unreacted maleic anhydride and other impurities are removed by washing with water and the like, and the solvent is removed by reducing the pressure, whereby the maleimide compound (A) is obtained. A dehydrating agent may be used during this reaction. A commercially available product may be used as the maleimide compound (A).

[Chem. 19]

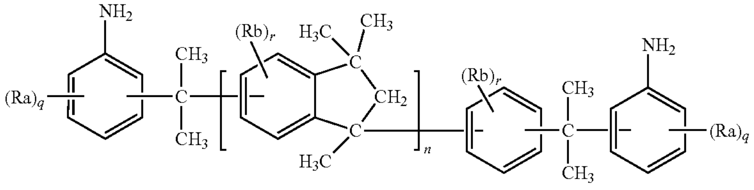

(19)

In Formula (19), "Ra"s are independent of each other. In other words, "Ra"s may be the same group as or different groups from each other, and for example, when q is 2 to 4, two to four "Ra"s bonded to the same benzene ring may be the same group as or different groups from each other. "Ra" represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group. "Rb" is the same as "Rb" in Formula (1), and "Rb"s each independently represent an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group. q represents 0 to 4. r represents 0 to 3. n represents 0.95 to 10.

The amine compound represented by Formula (19) is obtained by, for example, reacting 2,6-dimethylaniline with α,α'-dihydroxy-1,3-diisopropylbenzene in an organic solvent such as xylene using activated clay as a catalyst.

(Inorganic Filler)

The inorganic filler is not particularly limited as long as it is an inorganic filler that can be used as an inorganic filler contained in a resin composition. Examples of the inorganic filler include metal oxides such as silica, alumina, titanium oxide, magnesium oxide and mica, metal hydroxides such as magnesium hydroxide and aluminum hydroxide, talc, aluminum borate, barium sulfate, aluminum nitride, boron nitride, barium titanate, magnesium carbonate such as anhydrous magnesium carbonate, and calcium carbonate. Among these, silica, metal hydroxides such as magnesium hydroxide and aluminum hydroxide, aluminum oxide, boron nitride, and barium titanate are preferable, and silica is more preferable. The silica is not particularly limited, and examples thereof include crushed silica, spherical silica, and silica particles.

The inorganic filler may be an inorganic filler subjected to a surface treatment or an inorganic filler not subjected to a surface treatment. Examples of the surface treatment include treatment with a silane coupling agent.

Examples of the silane coupling agent include a silane coupling agent having at least one functional group selected from the group consisting of a vinyl group, a styryl group, a methacryloyl group, an acryloyl group, a phenylamino group, an isocyanurate group, a ureido group, a mercapto group, an isocyanate group, an epoxy group, and an acid anhydride group. In other words, examples of this silane coupling agent include compounds having at least one of a vinyl group, a styryl group, a methacryloyl group, an acryloyl group, a phenylamino group, an isocyanurate group, a ureido group, a mercapto group, an isocyanate group, an epoxy group, or an acid anhydride group as a reactive functional group, and further a hydrolyzable group such as a methoxy group or an ethoxy group.

Examples of the silane coupling agent include vinyltriethoxysilane and vinyltrimethoxysilane as those having a vinyl group. Examples of the silane coupling agent include p-styryltrimethoxysilane and p-styryltriethoxysilane as those having a styryl group. Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane as those having a methacryloyl group. Examples of the silane coupling agent include 3-acryloxypropyltrimethoxysilane and 3-acryloxypropyltriethoxysilane as those having an acryloyl group. Examples of the silane coupling agent include N-phenyl-3-aminopropyltrimethoxysilane and N-phenyl-3-aminopropyltriethoxysilane as those having a phenylamino group.

The average particle size of the inorganic filler is not particularly limited, and is preferably 0.05 to 10 μm, more preferably 0.5 to 8 μm. Here, the average particle size refers to the volume average particle size. The volume average particle size can be measured by, for example, a laser diffraction method and the like.

(Curing Agent)

The resin composition according to the present embodiment may contain a curing agent that reacts with at least one of the polyphenylene ether compound and the maleimide compound (A), if necessary, as long as the effects of the present invention are not impaired. Here, the curing agent refers to a compound that reacts with at least one of the polyphenylene ether compound and the maleimide compound (A) and contributes to curing of the resin composition. Examples of the curing agent include a maleimide compound (B) different from the maleimide compound (A), an epoxy compound, a methacrylate compound, an acrylate compound, a vinyl compound, a cyanate ester compound, an active ester compound, and an allyl compound.

The maleimide compound (B) is a maleimide compound that has a maleimide group in the molecule but does not have an indane structure in the molecule. Examples of the maleimide compound (B) include a maleimide compound having one or more maleimide groups in the molecule, and a modified maleimide compound. The maleimide compound (B) is not particularly limited as long as it has one or more maleimide groups in the molecule but does not have an indane structure in the molecule. Specific examples of the maleimide compound (B) include phenylmaleimide compounds such as 4,4'-diphenylmethanebismaleimide, polyphenylmethane maleimide, m-phenylenebismaleimide, bisphenol A diphenyl ether bismaleimide, 3,3'-dimethyl-5,5'-diethyl-4,4'-diphenylmethanebismaleimide, 4-methyl-1,3-phenylenebismaleimide, and a biphenylaralkyl type polymaleimide compound, and a N-alkylbismaleimide compound having an aliphatic skeleton. Examples of the modified maleimide compound include a modified maleimide compound in which a part of the molecule is modified with an amine compound and a modified maleimide compound in which a part of the molecule is modified with a silicone compound. As the maleimide compound (B), a commercially available product can also be used, and for example, the solid component in MIR-3000-70MT manufactured by Nippon Kayaku Co., Ltd., BMI-4000 and BMI-5100 manufactured by Daiwa Kasei Industry Co., Ltd., and BMI-689, BMI-1500, BMI-3000J and BMI-5000 manufactured by Designer Molecules Inc. may be used.

The epoxy compound is a compound having an epoxy group in the molecule, and specific examples thereof include a bisphenol type epoxy compound such as a bisphenol A type epoxy compound, a phenol novolac type epoxy compound, a cresol novolac type epoxy compound, a dicyclopentadiene type epoxy compound, a bisphenol A novolac type epoxy compound, a biphenylaralkyl type epoxy compound, and a naphthalene ring-containing epoxy compound. The epoxy compound also includes an epoxy resin, which is a polymer of each of the epoxy compounds.

The methacrylate compound is a compound having a methacryloyl group in the molecule, and examples thereof include a monofunctional methacrylate compound having one methacryloyl group in the molecule and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include dimethacrylate compounds such as tricyclodecanedimethanol dimethacrylate (DCP).

The acrylate compound is a compound having an acryloyl group in the molecule, and examples thereof include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include diacrylate compounds such as tricyclodecanedimethanol diacrylate.

The vinyl compound is a compound having a vinyl group in the molecule, and examples thereof include a monofunctional vinyl compound (monovinyl compound) having one vinyl group in the molecule and a polyfunctional vinyl compound having two or more vinyl groups in the molecule. Examples of the polyfunctional vinyl compound include divinylbenzene, curable polybutadiene having a carbon-carbon unsaturated double bond in the molecule, and a curable butadiene-styrene copolymer having a carbon-carbon unsaturated double bond in the molecule.

The cyanate ester compound is a compound having a cyanato group in the molecule, and examples thereof include 2,2-bis(4-cyanatophenyl)propane, bis(3,5-dimethyl-4-cyanatophenyl)methane, and 2,2-bis(4-cyanatophenyl)ethane.

The active ester compound is a compound having an ester group exhibiting high reaction activity in the molecule, and examples thereof include a benzenecarboxylic acid active ester, a benzenedicarboxylic acid active ester, a benzenetricarboxylic acid active ester, a benzenetetracarboxylic acid active ester, a naphthalenecarboxylic acid active ester, a naphthalenedicarboxylic acid active ester, a naphthalenetricarboxylic acid active ester, a naphthalenetetracarboxylic acid active ester, a fluorenecarboxylic acid active ester, a fluorenedicarboxylic acid active ester, a fluorenetricarboxylic acid active ester, and a fluorenetetracarboxylic acid active ester.

The allyl compound is a compound having an allyl group in the molecule, and examples thereof include a triallyl isocyanurate compound such as triallyl isocyanurate (TAIC), a diallyl bisphenol compound, and diallyl phthalate (DAP).

As the curing agent, the above curing agents may be used singly or in combination of two or more kinds thereof.

The weight average molecular weight of the curing agent is not particularly limited and is, for example, preferably 100 to 5000, more preferably 100 to 4000, still more preferably 100 to 3000. When the weight average molecular weight of the curing agent is too low, the curing agent may easily volatilize from the compounding component system of the resin composition. When the weight average molecular weight of the curing agent is too high, the viscosity of the varnish of the resin composition and the melt viscosity of the resin composition in the case of being in B stage become too high, and there is a risk of deterioration in moldability and deterioration in appearance after molding. Hence, a resin composition imparting superior heat resistance and moldability to its cured product is obtained when the weight average molecular weight of the curing agent is in such a range. It is considered that this is because the resin composition can be suitably cured. Here, the weight average molecular weight may be measured by a general molecular weight measurement method, and specific examples thereof include a value measured by gel permeation chromatography (GPC).

In the curing agent, the average number (number of functional groups) of the functional groups, which contribute to the reaction during curing of the resin composition, per one molecule of the curing agent varies depending on the weight average molecular weight of the curing agent but is, for example, preferably 1 to 20, more preferably 2 to 18. When this number of functional groups is too small, sufficient heat resistance of the cured product tends to be hardly attained. When the number of functional groups is too large, the reactivity is too high and, for example, troubles such as a decrease in the storage stability of the resin composition or a decrease in the fluidity of the resin composition may occur.

(Thermoplastic Styrenic Polymer)

The resin composition according to the present embodiment may contain a thermoplastic styrenic polymer, if necessary, as long as the effects of the present invention are not impaired.

The thermoplastic styrenic polymer is, for example, a polymer obtained by polymerizing a monomer containing a styrenic monomer, and may be a styrenic copolymer. Examples of the styrenic copolymer include a copolymer obtained by copolymerizing one or more styrenic monomers and one or more other monomers copolymerizable with the styrenic monomers. The thermoplastic styrenic polymer may be a hydrogenated styrenic copolymer obtained by hydrogenating the styrenic copolymer.

The styrenic monomer is not particularly limited, but examples thereof include styrene, a styrene derivative, one in which some the hydrogen atoms of the benzene ring in styrene are substituted with an alkyl group, one in which some the hydrogen atoms of the vinyl group in styrene are substituted with an alkyl group, vinyltoluene, α-methylstyrene, butylstyrene, dimethylstyrene, and isopropenyltoluene. As the styrenic monomer, these may be used singly or in combination of two or more kinds thereof.

The other copolymerizable monomer is not particularly limited, but examples thereof include olefins such as α-pinene, β-pinene, and dipentene, 1,4-hexadiene and 3-methyl-1,4-hexadiene unconjugated dienes, and 1,3-butadiene and 2-methyl-1,3-butadiene (isoprene) conjugated dienes. As the other copolymerizable monomer, these may be used singly or in combination of two or more kinds thereof.

Examples of the styrenic copolymer include a methylstyrene (ethylene/butylene) methylstyrene copolymer, a methylstyrene (ethylene-ethylene/propylene) methylstyrene copolymer, a styrene isoprene copolymer, a styrene isoprene styrene copolymer, a styrene (ethylene/butylene) styrene copolymer, a styrene (ethylene-ethylene/propylene) styrene copolymer, a styrene butadiene styrene copolymer, a styrene (butadiene/butylene) styrene copolymer, and a styrene isobutylene styrene copolymer.

Examples of the hydrogenated styrenic copolymer include hydrogenated products of the styrenic copolymers. Examples of the hydrogenated styrenic copolymer include a hydrogenated methylstyrene (ethylene/butylene) methylstyrene copolymer, a hydrogenated methylstyrene (ethylene-ethylene/propylene) methylstyrene copolymer, a hydrogenated styrene isoprene copolymer, a hydrogenated styrene isoprene styrene copolymer, a hydrogenated styrene (ethylene/butylene) styrene copolymer, and a hydrogenated styrene (ethylene-ethylene/propylene) styrene copolymer.

The thermoplastic styrenic polymers may be used singly or in combination of two or more kinds thereof.

The weight average molecular weight of thermoplastic styrenic polymer is preferably 1,000 to 300,000, more preferably 1,200 to 200,000. When the molecular weight is too low, the glass transition temperature or heat resistance of the cured product of the resin composition tends to decrease. When the molecular weight is too high, the viscosity of the resin composition when prepared in the form of a varnish and the viscosity of the resin composition during heat molding tend to be too high. The weight average molecular weight is only required to be one measured by a general molecular weight measurement method, and specific examples thereof include a value measured by gel permeation chromatography (GPC).

(Content)

The content of the maleimide compound (A) is preferably 1 to 90 parts by mass, more preferably 5 to 80 parts by mass, still more preferably 20 to 50 parts by mass with respect to 100 parts by mass of the total mass of the polyphenylene ether compound and the maleimide compound (A). The content of the polyphenylene ether compound is preferably 10 to 99 parts by mass, more preferably 20 to 95 parts by mass, still more preferably 20 to 70 parts by mass with respect to 100 parts by mass of the total mass of the polyphenylene ether compound and the maleimide compound (A). When the content of the maleimide compound (A) is too low, there is a tendency that the effect attained by addition of the maleimide compound (A) is unlikely to be exerted, and for example, excellent heat resistance is unlikely to be maintained. When the content of the maleimide compound (A) is too low, too high, or too high, the adhesive properties to a metal foil tend to decrease. For these reasons, when the content of each of the maleimide compound (A) and the polyphenylene ether compound is in the above range, a resin composition is obtained which affords a cured product that exhibits superior low dielectric properties, heat resistance, and adhesive properties to a metal foil and a lower water absorption.

The content of the inorganic filler is preferably 10 to 250 parts by mass, more preferably 40 to 200 parts by mass with respect to 100 parts by mass of the total mass of the polyphenylene ether compound and the maleimide compound (A).

As described above, the resin composition may contain a curing agent and a thermoplastic styrenic polymer. In a case where the resin composition contains the curing agent, the content of the curing agent is preferably 1 to 50 parts by mass, more preferably 5 to 40 parts by mass with respect to 100 parts by mass of the total mass of the polyphenylene ether compound and the maleimide compound (A). In a case where the resin composition contains the thermoplastic styrenic polymer, the content of the thermoplastic styrenic polymer is preferably 1 to 50 parts by mass, more preferably 5 to 40 parts by mass with respect to 100 parts by mass of the total mass of the polyphenylene ether compound and the maleimide compound (A).

(Other Components)

The resin composition according to the present embodiment may contain components (other components) other than the polyphenylene ether compound, the maleimide compound (A), and the inorganic filler, if necessary, as long as the effects of the present invention are not impaired. As the other components contained in the resin composition according to the present embodiment, for example, additives such as a reaction initiator, a reaction accelerator, a catalyst, a polymerization retarder, a polymerization inhibitor, a dispersant, a leveling agent, a silane coupling agent, an antifoaming agent, an antioxidant, a heat stabilizer, an antistatic agent, an ultraviolet absorber, a dye or pigment, and a lubricant may be further contained in addition to the curing agent and thermoplastic styrenic polymer as described above.

As described above, the resin composition according to the present embodiment may contain a reaction initiator. The reaction initiator is not particularly limited as long as it can promote the curing reaction of the resin composition, and examples thereof include a peroxide and an organic azo compound. Examples of the peroxide include α,α'-bis(t-butylperoxy-m-isopropyl)benzene, 2,5-dimethyl-2,5-di(t-butylperoxy)-3-hexyne, and benzoyl peroxide. Examples of the organic azo compound include azobisisobutyronitrile. A metal carboxylate can be concurrently used if necessary. By doing so, the curing reaction can be further promoted. Among these, α,α'-bis(t-butylperoxy-m-isopropyl)benzene is preferably used. α,α'-Bis(t-butylperoxy-m-isopropyl)benzene has a relatively high reaction initiation temperature and thus can suppress the promotion of the curing reaction at the time point at which curing is not required, for example, at the time of prepreg drying, and can suppress a decrease in storage stability of the resin composition. α,α'-Bis(t-butylperoxy-m-isopropyl)benzene exhibits low volatility, thus does not volatilize at the time of prepreg drying and storage, and exhibits favorable stability. The reaction initiators may be used singly or in combination of two or more thereof.

As described above, the resin composition according to the present embodiment may contain a silane coupling agent. The silane coupling agent may be contained in the resin composition or may be contained as a silane coupling agent covered on the inorganic filler contained in the resin composition for surface treatment in advance. Among these, it is preferable that the silane coupling agent is contained as a silane coupling agent covered on the inorganic filler for surface treatment in advance, and it is more preferable that the silane coupling agent is contained as a silane coupling agent covered on the inorganic filler for surface treatment in advance and further is also contained in the resin composition. In the case of a prepreg, the silane coupling agent may be contained in the prepreg as a silane coupling agent covered on the fibrous base material for surface treatment in advance. Examples of the silane coupling agent include those similar to the silane coupling agents used in the surface treatment of the inorganic filler described above.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, decabromodiphenyloxide, and tetradecabromodiphenoxybenzene which have a melting point of 300° C. or more are preferable. It is considered that the elimination of halogen at a high temperature and the decrease in heat resistance can be suppressed by the use of a halogen-based flame retardant. There is a case where a flame retardant containing phosphorus (phosphorus-based flame retardant) is used in fields required to be halogen-free. The phosphorus-based flame retardant is not particularly limited, and examples thereof include a phosphate ester-based flame retardant, a phosphazene-based flame retardant, a bis(diphenylphosphine oxide)-based flame retardant, and a phosphinate-based flame retardant. Specific examples of the phosphate ester-based flame retardant include a condensed phosphate ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as an aluminum dialkyl phosphinate. As the flame retardant, the respective flame retardants exemplified may be used singly or in combination of two or more kinds thereof.

(Production Method)

The method for producing the resin composition is not particularly limited, and examples thereof include a method in which the polyphenylene ether compound, the maleimide compound (A), and the inorganic filler are mixed together so as to have predetermined contents. Examples thereof include the method to be described later in the case of obtaining a varnish-like composition containing an organic solvent.

Moreover, by using the resin composition according to the present embodiment, a prepreg, a metal-clad laminate, a wiring board, a metal foil with resin, and a film with resin can be obtained as described below.

[Prepreg]

FIG. 1 is a schematic sectional view illustrating an example of a prepreg 1 according to an embodiment of the present invention.

As illustrated in FIG. 1, the prepreg 1 according to the present embodiment includes the resin composition or a semi-cured product 2 of the resin composition and a fibrous base material 3. This prepreg 1 includes the resin composition or the semi-cured product 2 of the resin composition and the fibrous base material 3 present in the resin composition or the semi-cured product 2 of the resin composition.

In the present embodiment, the semi-cured product is in a state in which the resin composition has been cured to an extent that the resin composition can be further cured. In other words, the semi-cured product is the resin composition in a semi-cured state (B-staged). For example, when a resin composition is heated, the viscosity of the resin composition first gradually decreases, then curing starts, and the viscosity gradually increases. In such a case, the semi-cured state includes a state in which the viscosity has started to increase but curing is not completed, and the like.

The prepreg to be obtained using the resin composition according to the present embodiment may include a semi-cured product of the resin composition as described above or include the uncured resin composition itself. In other words, the prepreg may be a prepreg including a semi-cured product of the resin composition (the resin composition in B stage) and a fibrous base material or a prepreg including the resin composition before being cured (the resin composition in A stage) and a fibrous base material. The resin composition or a semi-cured product of the resin composition may be one obtained by drying or heating and drying the resin composition.

When a prepreg is manufactured, the resin composition 2 is often prepared in a varnish form and used in order to be impregnated into the fibrous base material 3 which is a base material for forming the prepreg. In other words, the resin composition 2 is usually a resin varnish prepared in a varnish form in many cases. Such a varnish-like resin composition (resin varnish) is prepared, for example, as follows.

First, the respective components which can be dissolved in an organic solvent are introduced into and dissolved in an organic solvent. At this time, heating may be performed if necessary. Thereafter, components which are used if necessary but are not dissolved in the organic solvent are added to and dispersed in the solution until a predetermined dispersion state is achieved using a ball mill, a bead mill, a planetary mixer, a roll mill or the like, whereby a varnish-like resin composition is prepared. The organic solvent used here is not particularly limited as long as it dissolves the polyphenylene ether compound, the curing agent, and the like, and does not inhibit the curing reaction. Specific examples thereof include toluene and methyl ethyl ketone (MEK).

Specific examples of the fibrous base material include glass cloth, aramid cloth, polyester cloth, a glass nonwoven fabric, an aramid nonwoven fabric, a polyester nonwoven fabric, pulp paper, and linter paper. When glass cloth is used, a laminate exhibiting excellent mechanical strength is obtained, and glass cloth subjected to flattening is particularly preferable. Specific examples of the flattening include a method in which glass cloth is continuously pressed at an appropriate pressure using a press roll to flatly compress the yarn. The thickness of the generally used fibrous base material is, for example, 0.01 mm or more and 0.3 mm or less. The glass fiber constituting the glass cloth is not particularly limited, and examples thereof include Q glass, NE glass, E glass, S glass, T glass, L glass, and L2 glass. The surface of the fibrous base material may be subjected to a surface treatment with a silane coupling agent. The silane coupling agent is not particularly limited, but examples thereof include a silane coupling agent having at least one selected from the group consisting of a vinyl group, an acryloyl group, a methacryloyl group, a styryl group, an amino group, and an epoxy group in the molecule.

The method for manufacturing the prepreg is not particularly limited as long as the prepreg can be manufactured. Specifically, when the prepreg is manufactured, the resin composition according to the present embodiment described above is often prepared in a varnish form and used as a resin varnish as described above.

Specific examples of the method for manufacturing the prepreg 1 include a method in which the fibrous base material 3 is impregnated with the resin composition 2, for example, the resin composition 2 prepared in a varnish form, and then dried. The fibrous base material 3 is impregnated with the resin composition 2 by dipping, coating, and the like. If necessary, the impregnation can be repeated a plurality of times. Moreover, at this time, it is also possible to finally adjust the composition and impregnated amount to the desired composition and impregnated amount by repeating impregnation using a plurality of resin compositions having different compositions and concentrations.

The fibrous base material 3 impregnated with the resin composition (resin varnish) 2 is heated under desired heating conditions, for example, at 80° C. or more and 180° C. or less for 1 minute or more and 10 minutes or less. By heating, the prepreg 1 before being cured (A-stage) or in a semi-cured state (B-stage) is obtained. By the heating, the organic solvent can be decreased or removed by being volatilized from the resin varnish.

The resin composition according to the present embodiment is a resin composition, which affords a cured product exhibiting excellent low dielectric properties, heat resistance, and adhesive properties to a metal foil and a low water absorption. For this reason, the prepreg including this resin composition or a semi-cured product of this resin composition is a prepreg, which affords a cured product exhibiting excellent low dielectric properties, heat resistance, and adhesive properties to a metal foil and a low water absorption. Moreover, a wiring board including an insulating layer containing a cured product, which exhibits excellent low dielectric properties, heat resistance, and adhesive properties to a metal foil and a low water absorption can be suitably manufactured using this prepreg.

[Metal-Clad Laminate]

Figure 2:
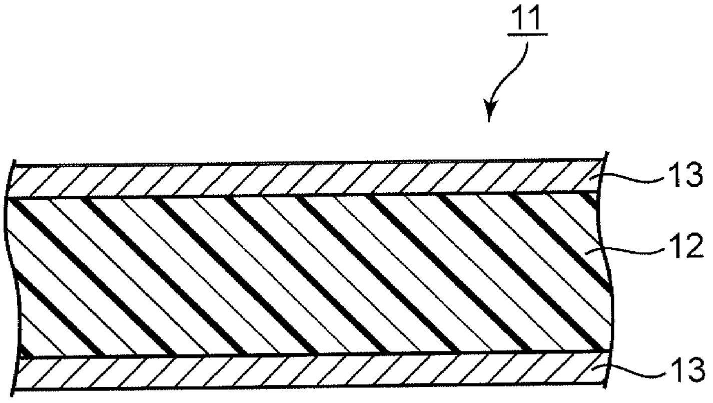
FIG. 2 is a schematic sectional view illustrating an example of a metal-clad laminate according to an embodiment of the present invention.

FIG. 2 is a schematic sectional view illustrating an example of a metal-clad laminate 11 according to an embodiment of the present invention.

As illustrated in FIG. 2, the metal-clad laminate 11 according to the present embodiment includes an insulating layer 12 containing a cured product of the resin composition and a metal foil 13 provided on the insulating layer 12. Examples of the metal-clad laminate 11 include a metal-clad laminate including an insulating layer 12 containing a cured product of the prepreg 1 illustrated in FIG. 1 and a metal foil 13 to be laminated together with the insulating layer 12. The insulating layer 12 may be formed of a cured product of the resin composition or a cured product of the prepreg. In addition, the thickness of the metal foil 13 varies depending on the performance and the like to be required for the finally obtained wiring board and is not particularly limited. The thickness of the metal foil 13 can be appropriately set depending on the desired purpose and is preferably, for example, 0.2 to 70 μm. Examples of the metal foil 13 include a copper foil and an aluminum foil, and the metal foil 13 may be a copper foil with carrier which includes a release layer and a carrier for the improvement in handleability in a case where the metal foil is thin.

The method for manufacturing the metal-clad laminate 11 is not particularly limited as long as the metal-clad laminate 11 can be manufactured. Specific examples thereof include a method in which the metal-clad laminate 11 is fabricated using the prepreg 1. Examples of this method include a method in which the double-sided metal foil-clad or single-sided metal foil-clad laminate 11 is fabricated by stacking one sheet or a plurality of sheets of prepreg 1, further stacking the metal foil 13 such as a copper foil on both or one of upper and lower surfaces of the prepregs 1, and laminating and integrating the metal foils 13 and prepregs 1 by heating and pressing. In other words, the metal-clad laminate 11 is obtained by laminating the metal foil 13 on the prepreg 1 and then performing heating and pressing. The heating and pressing conditions can be appropriately set depending on the thickness of the metal-clad laminate 11, the kind of the resin composition contained in the prepreg 1, and the like. For example, it is possible to set the temperature to 170° C. to 220° C., the pressure to 3 to 4 MPa, and the time to 60 to 150 minutes. Moreover, the metal-clad laminate may be manufactured without using a prepreg. Examples thereof include a method in which a varnish-like resin composition is applied on a metal foil to form a layer containing the resin composition on the metal foil and then heating and pressing is performed.

The resin composition according to the present embodiment is a resin composition, which affords a cured product exhibiting excellent low dielectric properties, heat resistance, and adhesive properties to a metal foil and a low water absorption. For this reason, the metal-clad laminate including an insulating layer containing the cured product of this resin composition is a metal-clad laminate including an insulating layer containing a cured product, which exhibits excellent low dielectric properties, heat resistance, and adhesive properties to a metal foil and a low water absorption. Moreover, a wiring board including an insulating layer containing a cured product, which exhibits excellent low dielectric properties, heat resistance, and adhesive properties to a metal foil and a low water absorption can be suitably manufactured using this metal-clad laminate.

[Wiring Board]

Figure 3:
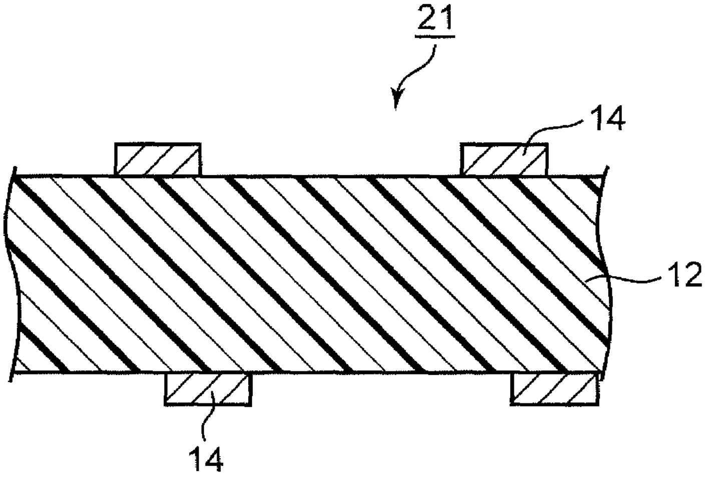
FIG. 3 is a schematic sectional view illustrating an example of a wiring board according to an embodiment of the present invention.

FIG. 3 is a schematic sectional view illustrating an example of a wiring board 21 according to an embodiment of the present invention.

As illustrated in FIG. 3, the wiring board 21 according to the present embodiment includes an insulating layer 12 containing a cured product of the resin composition and wiring 14 provided on the insulating layer 12. Examples of the wiring board 21 include a wiring board formed of an insulating layer 12 obtained by curing the prepreg 1 illustrated in FIG. 1 and wiring 14 which is laminated together with the insulating layer 12 and is formed by partially removing the metal foil 13. The insulating layer 12 may be formed of a cured product of the resin composition or a cured product of the prepreg.

The method for manufacturing the wiring board 21 is not particularly limited as long as the wiring board 21 can be manufactured. Specific examples thereof include a method in which the wiring board 21 is fabricated using the prepreg 1. Examples of this method include a method in which the wiring board 21, in which wiring is provided as a circuit on the surface of the insulating layer 12, is fabricated by forming wiring through etching and the like of the metal foil 13 on the surface of the metal-clad laminate 11 fabricated in the manner described above. In other words, the wiring board 21 is obtained by partially removing the metal foil 13 on the surface of the metal-clad laminate 11 and thus forming a circuit. Examples of the method for forming a circuit include circuit formation by a semi-additive process (SAP) or a modified semi-additive process (MSAP) in addition to the method described above. The wiring board 21 is a wiring board including an insulating layer 12 containing a cured product, which exhibits excellent low dielectric properties, heat resistance, and adhesive properties to a metal foil and a low water absorption.

[Metal Foil with Resin]

Figure 4:
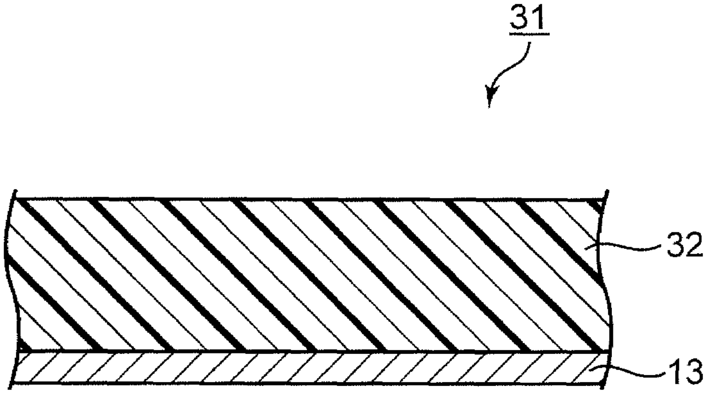
FIG. 4 is a schematic sectional view illustrating an example of a metal foil with resin according to an embodiment of the present invention.

FIG. 4 is a schematic sectional view illustrating an example of a metal foil with resin 31 according to the present embodiment.

The metal foil with resin 31 according to the present embodiment includes a resin layer 32 containing the resin composition or a semi-cured product of the resin composition and a metal foil 13 as illustrated in FIG. 4. The metal foil with resin 31 includes the metal foil 13 on the surface of the resin layer 32. In other words, the metal foil with resin 31 includes the resin layer 32 and the metal foil 13 to be laminated together with the resin layer 32. The metal foil with resin 31 may include other layers between the resin layer 32 and the metal foil 13.

The resin layer 32 may contain a semi-cured product of the resin composition as described above or may contain the uncured resin composition. In other words, the metal foil with resin 31 may be a metal foil with resin including a resin layer containing a semi-cured product of the resin composition (the resin composition in B stage) and a metal foil or a metal foil with resin including a resin layer containing the resin composition before being cured (the resin composition in A stage) and a metal foil. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the metal foil, metal foils used in metal-clad laminates or metal foils with resin can be used without limitation. Examples of the metal foil include a copper foil and an aluminum foil.

The metal foil with resin 31 may include a cover film and the like if necessary. By including a cover film, it is possible to prevent entry of foreign matter and the like. The cover film is not particularly limited, and examples thereof include a polyolefin film, a polyester film, a polymethylpentene film, and films formed by providing a release agent layer on these films.

The method for manufacturing the metal foil with resin 31 is not particularly limited as long as the metal foil with resin 31 can be manufactured. Examples of the method for manufacturing the metal foil with resin 31 include a method in which the varnish-like resin composition (resin varnish) is applied on the metal foil 13 and heated to manufacture the metal foil with resin 31. The varnish-like resin composition is applied on the metal foil 13 using, for example, a bar coater. The applied resin composition is heated under the conditions of, for example, 80° C. or more and 180° C. or less and 1 minute or more and 10 minutes or less. The heated resin composition is formed as the uncured resin layer 32 on the metal foil 13. By the heating, the organic solvent can be decreased or removed by being volatilized from the resin varnish.

The resin composition according to the present embodiment is a resin composition, which affords a cured product exhibiting excellent low dielectric properties, heat resistance, and adhesive properties to a metal foil and a low water absorption. For this reason, the metal foil with resin including a resin layer containing this resin composition or a semi-cured product of this resin composition is a metal foil with resin including a resin layer, which affords a cured product exhibiting excellent low dielectric properties, heat resistance, and adhesive properties to a metal foil and a low water absorption. Moreover, this metal foil with resin can be used in the manufacture of a wiring board including an insulating layer containing a cured product, which exhibits excellent low dielectric properties, heat resistance, and adhesive properties to a metal foil and a low water absorption. For example, by laminating the metal foil with resin on a wiring board, a multilayer wiring board can be manufactured. As a wiring board obtained using such a metal foil with resin, there is obtained a wiring board including an insulating layer containing a cured product, which exhibits excellent low dielectric properties, heat resistance, and adhesive properties to a metal foil and a low water absorption.

[Film with Resin]

Figure 5:
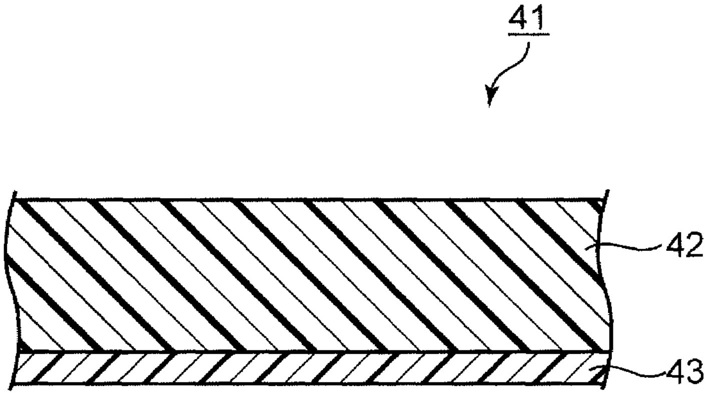
FIG. 5 is a schematic sectional view illustrating an example of a film with resin according to an embodiment of the present invention.

FIG. 5 is a schematic sectional view illustrating an example of a film with resin 41 according to the present embodiment.

The film with resin 41 according to the present embodiment includes a resin layer 42 containing the resin composition or a semi-cured product of the resin composition and a support film 43 as illustrated in FIG. 5. The film with resin 41 includes the resin layer 42 and the support film 43 to be laminated together with the resin layer 42. The film with resin 41 may include other layers between the resin layer 42 and the support film 43.

The resin layer 42 may contain a semi-cured product of the resin composition as described above or may contain the uncured resin composition. In other words, the film with resin 41 may be a film with resin including a resin layer containing a semi-cured product of the resin composition (the resin composition in B stage) and a support film or a film with resin including a resin layer containing the resin composition before being cured (the resin composition in A stage) and a support film. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the support film 43, support films used in films with resin can be used without limitation. Examples of the support film include electrically insulating films such as a polyester film, a polyethylene terephthalate (PET) film, a polyimide film, a polyparabanic acid film, a polyether ether ketone film, a polyphenylene sulfide film, a polyamide film, a polycarbonate film, and a polyarylate film.

The film with resin 41 may include a cover film and the like if necessary. By including a cover film, it is possible to prevent entry of foreign matter and the like. The cover film is not particularly limited, and examples thereof include a polyolefin film, a polyester film, and a polymethylpentene film.

The support film and the cover film may be those subjected to surface treatments such as a matt treatment, a corona treatment, a release treatment, and a roughening treatment if necessary.

The method for manufacturing the film with resin 41 is not particularly limited as long as the film with resin 41 can be manufactured. Examples of the method for manufacturing the film with resin 41 include a method in which the varnish-like resin composition (resin varnish) is applied on the support film 43 and heated to manufacture the film with resin 41. The varnish-like resin composition is applied on the support film 43 using, for example, a bar coater. The applied resin composition is heated under the conditions of, for example, 80° C. or more and 180° C. or less and 1 minute or more and 10 minutes or less. The heated resin composition is formed as the uncured resin layer 42 on the support film 43. By the heating, the organic solvent can be decreased or removed by being volatilized from the resin varnish.

The resin composition according to the present embodiment is a resin composition, which affords a cured product exhibiting excellent low dielectric properties, heat resistance, and adhesive properties to a metal foil and a low water absorption. For this reason, the film with resin including a resin layer containing this resin composition or a semi-cured product of this resin composition is a film with resin including a resin layer, which affords a cured product exhibiting excellent low dielectric properties, heat resistance, and adhesive properties to a metal foil and a low water absorption. Moreover, this film with resin can be used in the manufacture of a wiring board including an insulating layer containing a cured product, which exhibits excellent low dielectric properties, heat resistance, and adhesive properties to a metal foil and a low water absorption. A multilayer wiring board can be manufactured, for example, by laminating the film with resin on a wiring board and then peeling off the support film from the film with resin or by peeling off the support film from the film with resin and then laminating the film with resin on a wiring board. As a wiring board obtained using such a film with resin, there is obtained a wiring board including an insulating layer containing a cured product, which exhibits excellent low dielectric properties, heat resistance, and adhesive properties to a metal foil and a low water absorption.

According to the present invention, it is possible to provide a resin composition, which affords a cured product exhibiting excellent low dielectric properties, heat resistance, and adhesive properties to a metal foil and a low water absorption. In addition, according to the present invention, a prepreg, a film with resin, a metal foil with resin, a metal-clad laminate, and a wiring board which are obtained using the resin composition are provided.

Hereinafter, the present invention will be described more specifically with reference to examples, but the scope of the present invention is not limited thereto.

EXAMPLES

Examples 1 to 25 and Comparative Examples 1 to 5

The respective components used when a resin composition is prepared in the present Examples will be described.

(Polyphenylene Ether Compound: PPE)

Modified PPE-1: Polyphenylene ether compound having vinylbenzyl group (ethenylbenzyl group) at terminal (OPE-2st 1200 manufactured by MITSUBISHI GAS CHEMICAL COMPANY, a modified polyphenylene ether compound, which has Mn of 1200 and is represented by Formula (12), where Ar is a phenylene group, $R_1$ to $R_3$ are a hydrogen atom, and p is 1)

Modified PPE-2: Polyphenylene ether compound having vinylbenzyl group (ethenylbenzyl group) at terminal (OPE-2st 2200 manufactured by MITSUBISHI GAS CHEMICAL COMPANY, a modified polyphenylene ether compound, which has Mn of 2200 and is represented by Formula (12), where Ar is a phenylene group, $R_1$ to $R_3$ are a hydrogen atom, and p is 1)

Modified PPE-3: Polyphenylene ether compound having vinylbenzyl group (ethenylbenzyl group) at terminal (a modified polyphenylene ether compound obtained by reacting polyphenylene ether with chloromethylstyrene)

Specifically, this is a modified polyphenylene ether compound obtained by conducting a reaction as follows.

First, 200 g of polyphenylene ether (SA90 manufactured by SABIC Innovative Plastics Co., Ltd., number of terminal hydroxyl groups: 2, weight average molecular weight Mw: 1700), 30 g of a mixture containing p-chloromethylstyrene and m-chloromethylstyrene at a mass ratio of 50:50 (chloromethylstyrene: CMS manufactured by Tokyo Chemical Industry Co., Ltd.), 1.227 g of tetra-n-butylammonium bromide as a phase transfer catalyst, and 400 g of toluene were introduced into a 1-liter three-necked flask equipped with a temperature controller, a stirrer, cooling equipment, and a dropping funnel and stirred. Then, the mixture was stirred until polyphenylene ether, chloromethylstyrene, and tetra-n-butylammonium bromide were dissolved in toluene. At that time, the mixture was gradually heated until the liquid temperature finally reached 75° C. Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10% by mass and then a large amount of methanol was added into the flask. By doing so, a precipitate was generated in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours.

The obtained solid was analyzed by 1H-NMR (400 MHz, $CDCl_3$, TMS). As a result of NMR measurement, a peak attributed to a vinylbenzyl group (ethenylbenzyl group) was observed at 5 to 7 ppm. This made it possible to confirm that the obtained solid was a modified polyphenylene ether compound having a vinylbenzyl group (ethenylbenzyl group) as the substituent at the molecular terminal in the molecule. Specifically, it was confirmed that the obtained solid was ethenylbenzylated polyphenylene ether. This modified polyphenylene ether compound obtained was a modified polyphenylene ether compound represented by Formula (13), where Y was a dimethylmethylene group (a group represented by Formula (11), where $R_{33}$ and $R_{34}$ were a methyl group), Ar was a phenylene group, $R_1$ to $R_3$ were a hydrogen atom, and p was 1.

The number of terminal functional groups in the modified polyphenylene ether was measured as follows.

First, the modified polyphenylene ether was accurately weighed. The weight at that time is defined as X (mg). Thereafter, this modified polyphenylene ether weighed was dissolved in 25 mL of methylene chloride, 100 μL of an ethanol solution of tetraethylammonium hydroxide (TEAH) at 10% by mass (TEAH: ethanol (volume ratio)=15:85) was added to the solution, and then the absorbance (Abs) of this mixture at 318 nm was measured using a UV spectrophotometer (UV-1600 manufactured by Shimadzu Corporation). Then, the number of terminal hydroxyl groups in the modified polyphenylene ether was calculated from the measurement results using the following equation.

$$\text{Residual } OH \text{ amount}(\mu mol/g)=[(25\times\text{Abs})/(\varepsilon\times OPL\times X)]\times 10^6$$

Here, ε indicates the extinction coefficient and is 4700 L/mol·cm. OPL indicates the cell path length and is 1 cm.

Since the calculated residual OH amount (the number of terminal hydroxyl groups) in the modified polyphenylene ether is almost zero, it was found that the hydroxyl groups in the polyphenylene ether before being modified are almost modified. From this fact, it was found that the number of terminal hydroxyl groups decreased from the number of terminal hydroxyl groups in polyphenylene ether before being modified is the number of terminal hydroxyl groups in polyphenylene ether before being modified. In other words, it was found that the number of terminal hydroxyl groups in polyphenylene ether before being modified is the number of terminal functional groups in the modified polyphenylene ether. In other words, the number of terminal functional groups was two.

In addition, the intrinsic viscosity (IV) of the modified polyphenylene ether was measured in methylene chloride at 25° C. Specifically, the intrinsic viscosity (IV) of the modified polyphenylene ether was measured in a methylene chloride solution (liquid temperature: 25° C.) of the modified polyphenylene ether at 0.18 g/45 ml using a viscometer (AVS500 Visco System manufactured by SCHOTT Instruments GmbH). As a result, the intrinsic viscosity (IV) of the modified polyphenylene ether was 0.086 dl/g.

The molecular weight distribution of the modified polyphenylene ether was measured by GPC. Moreover, the weight average molecular weight (Mw) was calculated from the obtained molecular weight distribution. As a result, Mw was 1900.

Modified PPE-4: Modified polyphenylene ether obtained by modifying terminal hydroxyl group of polyphenylene ether with methacryl group (a modified polyphenylene ether compound represented by Formula (14), where Y is a dimethylmethylene group (a group represented by Formula (11), where $R_{33}$ and $R_{34}$ are a methyl group), SA9000 manufactured by SABIC Innovative Plastics Co., Ltd., weight average molecular weight Mw: 2000, number of terminal functional groups: 2)

Unmodified PPE: Polyphenylene ether (PPE) (SA90 manufactured by SABIC Innovative Plastics Co., Ltd., intrinsic viscosity (IV): 0.083 dl/g, number of terminal hydroxyl groups: 2, weight average molecular weight Mw: 1700)

(Maleimide Compound (A))

Maleimide compound (A): Maleimide compound represented by Formula (2) (a maleimide compound having an indane structure in the molecule).

Specifically, this is a maleimide compound synthesized as follows.

First, into a 1-L flask equipped with a thermometer, a condenser, a Dean-Stark tube, and a stirrer, 48.5 g (0.4 mol) of 2,6-dimethylaniline, 272.0 g (1.4 mol) of α,α'-dihydroxy-1,3-diisopropylbenzene, 280 g of xylene, and 70 g of activated clay were introduced and heated to 120° C. while being stirred. Further, the temperature was raised to 210° C. while removing the distilled water through the Dean-Stark tube. By doing so, the reaction was conducted for 6 hours. After that, the reaction mixture was cooled to 140° C., 145.4 g (1.2 mol) of 2,6-dimethylaniline was introduced, and then the temperature was raised to 220° C. By doing so, the reaction was conducted for 3 hours. After the reaction, the reaction mixture was air-cooled to 100° C., and diluted with 300 g of toluene, and activated clay was removed by filtration, and low molecular weight substances such as the solvent and unreacted substances were distilled off under reduced pressure, thereby obtaining 345.2 g of a solid. The obtained solid was an amine compound (amine equivalent: 348, softening point: 71° C.) represented by the following Formula (20).

[Chem. 20]

(20)

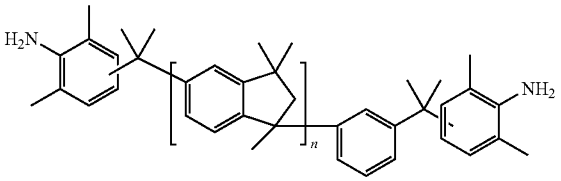

Next, 131.8 g (1.3 mol) of maleic anhydride and 700 g of toluene were introduced into a 2-L flask equipped with a thermometer, a condenser, a Dean-Stark tube, and a stirrer, and stirred at room temperature. After that, a mixed solution of 345.2 g of the amine compound represented by Formula (20) and 175 g of DMF was added dropwise over 1 hour. After completion of the dropwise addition, the mixture was further stirred at room temperature for 2 hours to conduct the reaction. After that, 37.1 g of p-toluenesulfonic acid monohydrate was added, the reaction solution was heated, and the azeotropic water and toluene were cooled and separated under reflux, and then only toluene was returned to the system, thereby conducting the dehydration reaction for 8 hours. After air-cooling to room temperature, the reaction mixture was concentrated under reduced pressure, the brown solution was dissolved in 600 g of ethyl acetate and washed with 150 g of deionized water three times and 150 g of 2% aqueous sodium bicarbonate solution three times, sodium sulfate was added for drying, then concentration was performed under reduced pressure, and the obtained reaction product was vacuum-dried at 80° C. for 4 hours, thereby obtaining 407.6 g of a solid. The obtained solid was analyzed by FD-MS spectrum, GPC and the like, and was found to be a maleimide compound represented by Formula (2) (n=2.59, molecular weight distribution (Mw/Mn)=1.49).

(Inorganic Filler)

Silica: Silica particles subjected to surface treatment with silane coupling agent having phenylamino group in molecule (SC2500-SXJ manufactured by Admatechs Company Limited)

(Curing Agent)

Epoxy compound: Dicyclopentadiene type epoxy resin (HP-7200 manufactured by DIC Corporation)

Maleimide compound (B)-1: Maleimide compound not having indane structure in molecule (biphenylaralkyl type maleimide compound, solid component in MIR-3000-70MT (maleimide compound dissolved in methyl ethyl ketone-toluene mixed solvent) manufactured by Nippon Kayaku Co., Ltd.)

Maleimide compound (B)-2: Maleimide compound not having indane structure in molecule (N-alkyl bismaleimide compound, BMI-689 manufactured by Designer Molecules Inc.)

Maleimide compound (B)-3: Maleimide compound not having indane structure in molecule (N-alkyl bismaleimide compound, BMI-1500 manufactured by Designer Molecules Inc.)

Maleimide compound (B)-4: Maleimide compound not having indane structure in molecule (BMI-4000 manufactured by Daiwa Kasei Industry Co., Ltd.)

Allyl compound: Triallyl isocyanurate (TAIC) (TAIC manufactured by Nihon Kasei CO., LTD.)

Methacrylate compound: Tricyclodecane dimethanol dimethacrylate (NK Ester DCP manufactured by SHIN-NAKAMURA CHEMICAL Co., Ltd.)

Polyfunctional vinyl compound: Liquid curable butadiene-styrene copolymer having carbon-carbon unsaturated double bond in molecule (Ricon181 manufactured by CRAY VALLEY)

(Thermoplastic Styrenic Polymer)

V9827: Hydrogenated methylstyrene (ethylene/butylene) methylstyrene copolymer (V9827 manufactured by Kuraray Co., Ltd., weight average molecular weight Mw: 92,000)

FTR6125: Styrenic polymer (FTR6125 manufactured by Mitsui Chemicals, Inc., weight average molecular weight Mw: 1950, number average molecular weight Mn: 1150)

(Reaction Initiator)

PBP: α,α'-Di(t-butylperoxy)diisopropylbenzene (Perbutyl P (PBP) manufactured by NOF CORPORATION)

(Reaction Accelerator)

2E4MZ: 2-Ethyl-4-methylimidazole (2E4MZ manufactured by SHIKOKU CHEMICALS CORPORATION)

[Preparation Method]

Varnish-like resin compositions (varnishes) according to Examples 1 to 17, Examples 19 to 24, and Comparative Examples 1 to 5 were prepared as follows. First, the respective components other than the inorganic filler were added to and mixed in toluene at the compositions (parts by mass) presented in Tables 1 to 3 so that the solid concentration was 50% by mass. The mixture was stirred for 60 minutes.

Thereafter, the filler was added to the obtained liquid, and the inorganic filler was dispersed in the liquid using a bead mill. By doing so, a varnish-like resin composition (varnish) was obtained. As the varnish-like resin compositions (varnishes) according to Examples 18 and 25, varnish-like resin compositions (varnishes) were obtained in the same manner as the method for preparing a varnish-like resin composition according to Example 1 except that methyl ethyl ketone was used instead of toluene.

Next, a prepreg and an evaluation substrate (metal-clad laminate) were obtained as follows.

The obtained varnish was impregnated into a fibrous base material (glass cloth: #1067 type, E glass manufactured by Nitto Boseki Co., Ltd.) and then heated and dried at 130° C. for 3 minutes, thereby fabricating a prepreg. At that time, the content (resin content) of the components constituting the resin composition with respect to the prepreg was adjusted to be 74% by mass by the curing reaction.

Next, an evaluation substrate (metal-clad laminate) was obtained as follows.

Eleven sheets of each prepreg obtained were stacked, and a copper foil (GTH-MP manufactured by FURUKAWA CIRCUIT FOIL TAIWAN CORPORATION, thickness: 12 μm) was disposed on both sides of the stacked body. This as a body to be pressed was heated to a temperature of 200° C. at a rate of temperature rise of 4° C./min and heated and pressed under the conditions of 200° C., 120 minutes, and a pressure of 4 MPa, thereby obtaining an evaluation substrate (metal-clad laminate) having a copper foil bonded to both surfaces and a thickness of about 830 jam.

The prepregs and evaluation substrates (metal-clad laminates) fabricated as described above were evaluated by the following methods.

[Peel Strength]

The copper foil was peeled off from the evaluation substrate (metal-clad laminate), and the peel strength at that time was measured in conformity with JIS C 6481 (1996). Specifically, a pattern having a width of 10 mm and a length of 100 mm was formed on the evaluation substrate, the copper foil was peeled off at a speed of 50 mm/min using a tensile tester, and the peel strength (N/mm) at that time was measured.

[Heat Resistance]

The heat resistance of the evaluation substrate (metal-clad laminate) was measured in conformity with the standard of JIS C 6481 (1996). Specifically, the evaluation substrate (metal-clad laminate) cut into a predetermined size was used as a test piece, and this test piece was left for 1 hour in thermostatic chambers set to 280° C., 290° C., and 300° C., respectively, and then taken out. The presence or absence of blistering on the test piece subjected to a heat treatment in this manner was visually observed. It was evaluated as "Very Good" when blistering was not confirmed after the heat treatment in a thermostatic chamber set to 300° C. It was evaluated as "Good" when blistering was confirmed after the heat treatment in a thermostatic chamber set to 300° C. but blistering was not confirmed after the heat treatment in a thermostatic chamber set to 290° C. It was evaluated as "Fair" when blistering was confirmed after the heat treatment in a thermostatic chamber set to 290° C. but blistering was not confirmed after the heat treatment in a thermostatic chamber set to 280° C. It was evaluated as "Poor" when blistering was confirmed after the heat treatment in a thermostatic chamber set to 280° C.

[Water Absorption]

The water absorption (%) was measured in conformity with IPC-TM-650 2.6.2.1 using an unclad substrate obtained by removing the copper foil from the evaluation substrate (metal-clad laminate) by etching as a test piece.

[Dielectric Properties (Relative Dielectric Constant and Dielectric Loss Tangent)]

The relative dielectric constant and dielectric loss tangent at 10 GHz were measured by the cavity perturbation method using an unclad substrate obtained by removing the copper foil from the evaluation substrate (metal-clad laminate) by etching as a test piece. Specifically, the relative dielectric constant and dielectric loss tangent of the evaluation substrate at 10 GHz were measured using a network analyzer (N5230A manufactured by Keysight Technologies).

The results of each of the evaluations are presented in Tables 1 to 3.

TABLE 1

| | | | Example | | | | |
|---|---|---|---|---|---|---|---|
| | | | 1 | 2 | 3 | 4 | 5 |
| Composition (parts by mass) | PPE | Modified PPE-1 | 60 | 60 | — | — | — |
| | | Modified PPE-2 | — | — | 60 | — | — |
| | | Modified PPE-3 | — | — | — | 60 | — |
| | | Modified PPE-4 | — | — | — | — | 60 |
| | | Unmodified PPE | — | — | — | — | — |
| | Maleimide compound (A) | Maleimide compound (A) | 40 | 40 | 40 | 40 | 40 |
| | Inorganic filler | Silica | 128.0 | 128.0 | 128.0 | 128.0 | 128.0 |
| | Curing agent | Maleimide compound (B)-1 | — | — | — | — | — |
| | Reaction initiator | PBP | — | 1 | 1 | 1 | 1 |
| | Reaction accelerator | 2E4MZ | — | — | — | — | — |
| Evaluation | Peel strength (N/mm) | | 0.75 | 0.75 | 0.75 | 0.75 | 0.75 |
| | Heat resistance | | Good | Very Good | Very Good | Very Good | Very Good |
| | Water absorption (%) | | Good | Good | Good | Good | Good |
| | Dielectric properties | Relative dielectric constant | 3.4 | 3.4 | 3.4 | 3.4 | 3.4 |
| | | Dielectric loss tangent | 0.0035 | 0.0035 | 0.0035 | 0.0035 | 0.0037 |

TABLE 1-continued

| | | | Comparative Example | | | | |
|---|---|---|---|---|---|---|---|
| | | | 1 | 2 | 3 | 4 | 5 |
| Composition (parts by mass) | PPE | Modified PPE-1 | 60 | — | — | 100 | — |
| | | Modified PPE-2 | — | — | — | — | — |
| | | Modified PPE-3 | — | — | — | — | — |
| | | Modified PPE-4 | — | — | — | — | — |
| | | Unmodified PPE | — | 60 | 60 | — | — |
| | Maleimide compound (A) | Maleimide compound (A) | — | 40 | 40 | — | 100 |
| | Inorganic filler | Silica | 128.0 | 128.0 | 128.0 | 128.0 | 128.0 |
| | Curing agent | Maleimide compound (B)-1 | 40 | — | — | — | — |
| | Reaction initiator | PBP | 1 | 1 | — | 1 | 1 |
| | Reaction accelerator | 2E4MZ | — | — | 0.5 | — | — |
| Evaluation | Peel strength (N/mm) | | 0.60 | 0.35 | 0.60 | 0.55 | 0.55 |
| | Heat resistance | | Very Good | Poor | Very Good | Fair | Very Good |
| | Water absorption (%) | | Poor | Poor | Poor | Good | Good |
| | Dielectric properties | Relative dielectric constant | 3.6 | 3.7 | 3.7 | 3.5 | 3.3 |
| | | Dielectric loss tangent | 0.0045 | 0.0070 | 0.0070 | 0.0040 | 0.0030 |

TABLE 2

| | | | Example | | | | | | | |
|---|---|---|---|---|---|---|---|---|---|---|
| | | | 6 | 7 | 8 | 9 | 10 | 11 | 12 | 13 |
| Composition (parts by mass) | PPE | Modified PPE-1 | 99 | 95 | 80 | 70 | 50 | 20 | 10 | 5 |
| | Maleimide compound (A) | Maleimide compound (A) | 1 | 5 | 20 | 30 | 50 | 80 | 90 | 95 |
| | Inorganic filler | Silica | 128.0 | 128.0 | 128.0 | 128.0 | 128.0 | 128.0 | 128.0 | 128.0 |
| | Reaction initiator | PBP | 1 | 1 | 1 | 1 | 1 | 1 | 1 | 1 |
| Evaluation | Peel strength (N/mm) | | 0.60 | 0.70 | 0.75 | 0.75 | 0.75 | 0.70 | 0.60 | 0.57 |
| | Heat resistance | | Good | Very Good | Very Good | Very Good | Very Good | Very Good | Very Good | Very Good |
| | Water absorption (%) | | Good | Good | Good | Good | Good | Good | Good | Good |
| | Dielectric properties | Relative dielectric constant | 3.5 | 3.5 | 3.4 | 3.4 | 3.3 | 3.3 | 3.3 | 3.3 |
| | | Dielectric loss tangent | 0.0040 | 0.0039 | 0.0037 | 0.0036 | 0.0034 | 0.0032 | 0.0031 | 0.0030 |

TABLE 3

| | | | Example | | | | | |
|---|---|---|---|---|---|---|---|---|
| | | | 14 | 15 | 16 | 17 | 18 | 19 |
| Composition (parts by mass) | PPE | Modified PPE-1 | 60 | 60 | 60 | 60 | 60 | 60 |
| | Maleimide compound (A) | Maleimide compound (A) | 40 | 40 | 40 | 40 | 40 | 40 |
| | Inorganic filler | Silica | 134.4 | 140.8 | 160.0 | 140.8 | 140.8 | 140.8 |
| | Curing agent | Epoxy compound | 5 | — | — | — | — | — |
| | | Maleimide compound (B)-2 | — | 10 | 25 | — | — | — |
| | | Maleimide compound (B)-3 | — | — | — | 10 | — | — |
| | | Maleimide compound (B)-4 | — | — | — | — | 10 | — |
| | | Allyl compound | — | — | — | — | — | 10 |
| | | Methacrylate compound | — | — | — | — | — | — |
| | | Polyfunctional vinyl compound | — | — | — | — | — | — |
| | Thermoplastic styrenic polymer | V9827 | — | — | — | — | — | — |
| | | FTR6125 | — | — | — | — | — | — |
| | Reaction initiator | PBP | 1 | 1 | 1 | 1 | 1 | 1 |
| | Reaction accelerator | 2E4MZ | 0.01 | — | — | — | — | — |

TABLE 3-continued

| | | | | | | | | |
|---|---|---|---|---|---|---|---|---|
| Evaluation | Peel strength (N/mm) | | 0.78 | 0.80 | 0.82 | 0.80 | 0.75 | 0.75 |
| | Heat resistance | | Very Good | Very Good | Very Good | Very Good | Very Good | Very Good |
| | Water absorption (%) | | Good | Good | Good | Good | Good | Good |
| | Dielectric properties | Relative dielectric constant | 3.4 | 3.3 | 3.2 | 3.3 | 3.4 | 3.4 |
| | | Dielectric loss tangent | 0.0038 | 0.0033 | 0.0030 | 0.0032 | 0.0036 | 0.0037 |

| | | | Example | | | | | |
|---|---|---|---|---|---|---|---|---|
| | | | 20 | 21 | 22 | 23 | 24 | 25 |
| Composition (parts by mass) | PPE | Modified PPE-1 | 60 | 60 | 60 | 60 | 60 | 60 |
| | Maleimide compound (A) | Maleimide compound (A) | 40 | 40 | 40 | 40 | 40 | 40 |
| | Inorganic filler | Silica | 140.8 | 140.8 | 140.8 | 140.8 | 140.8 | 140.8 |
| | Curing agent | Epoxy compound | — | — | — | — | — | — |
| | | Maleimide compound (B)-2 | — | — | — | — | 5 | |
| | | Maleimide compound (B)-3 | — | — | — | — | — | — |
| | | Maleimide compound (B)-4 | — | — | — | — | — | 5 |
| | | Allyl compound | — | — | — | — | — | — |
| | | Methacrylate compound | 10 | — | — | — | — | — |
| | | Polyfunctional vinyl compound | — | 10 | — | — | — | — |
| | Thermoplastic styrenic polymer | V9827 | — | — | 10 | — | — | — |
| | | FTR6125 | — | — | — | 10 | 5 | 5 |
| | Reaction initiator | PBP | 1 | 1 | 1 | 1 | 1 | 1 |
| | Reaction accelerator | 2E4MZ | — | — | — | — | — | — |
| Evaluation | Peel strength (N/mm) | | 0.75 | 0.70 | 0.68 | 0.68 | 0.75 | 0.75 |
| | Heat resistance | | Very Good | Very Good | Very Good | Very Good | Very Good | Very Good |
| | Water absorption (%) | | Good | Good | Good | Good | Good | Good |
| | Dielectric properties | Relative dielectric constant | 3.4 | 3.3 | 3.3 | 3.3 | 3.3 | 3.4 |
| | | Dielectric loss tangent | 0.0037 | 0.0032 | 0.0032 | 0.0032 | 0.0033 | 0.0034 |

As can be seen from Tables 1 to 3, in resin compositions containing a polyphenylene ether compound having a carbon-carbon unsaturated double bond at the terminal, in the case of using resin compositions (Examples 1 to 25) containing a maleimide compound having an indane structure in the molecule (maleimide compound (A)) and an inorganic filler, cured products having a higher peel strength and higher heat resistance, a lower water absorption, a lower relative dielectric constant and a lower dielectric loss tangent were obtained as compared to the case of not using these resin compositions. Specifically, the cured product obtained using the resin composition according to Example 2 had a lower relative dielectric constant and a lower dielectric loss tangent, a higher peel strength, and a lower water absorption as compared to the cured product obtained using the resin composition according to Comparative Example 1, which is the same as the resin composition according to Example 2 except that the resin composition contained a maleimide compound not having an indane structure in the molecule (the maleimide compounds compound (B)-1) instead of the maleimide compound (A) as a maleimide compound. The cured product obtained using the resin composition according to Example 2 had a lower relative dielectric constant and a lower dielectric loss tangent, higher heat resistance, a higher peel strength, and a lower water absorption as compared to the case (Comparative Example 2) of using an unmodified PPE instead of a polyphenylene ether compound having a carbon-carbon unsaturated double bond at the terminal. In the case (Comparative Example 3) of using unmodified PPE and a reaction accelerator, the heat resistance increases as compared to that of Comparative Example 2. Even so, the cured product obtained using the resin composition according to Example 2 had a lower relative dielectric constant and a lower dielectric loss tangent, a higher peel strength, and a lower water absorption as compared to that of Comparative Example 3. The cured product obtained using the resin composition according to Example 2 had higher heat resistance and a higher peel strength as compared to the cured product obtained using the resin composition not containing a maleimide compound according to Comparative Example 4. The cured product obtained using the resin composition according to Example 2 had a higher peel strength as compared to the cured product obtained using the resin composition not containing a polyphenylene ether compound having a carbon-carbon unsaturated double bond at the terminal according to Comparative Example 5. From these facts, it has been found that the resin compositions according to Examples 1 to 25 afford cured products, which exhibit excellent low dielectric properties, heat resistance, and adhesive properties to a metal foil and a low water absorption.

In a case (Examples 6 to 12) where the content of the maleimide compound (A) was 1 to 90 parts by mass with respect to 100 parts by mass of the total mass of the polyphenylene ether compound and the maleimide compound (A), the peel strength was higher as compared to the case (Example 13) where the content of the maleimide compound (A) exceeded 90 parts by mass. From this fact, it has been found that it is preferable that the content of the maleimide compound (A) is 1 to 90 parts by mass from the viewpoint of enhancing the adhesive properties to a copper foil. From Table 3, it has been found that a cured product, which exhibits excellent low dielectric properties, heat resistance, and adhesive properties to a metal foil and a low water absorption is obtained when the resin composition further contains a curing agent and a thermoplastic styrenic polymer.

This application is based on Japanese Patent Application No. 2020-153178 filed on Sep. 11, 2020, the contents of which are included in the present application.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

According to the present invention, there is provided a resin composition, which affords a cured product exhibiting excellent low dielectric properties, heat resistance, and adhesive properties to a metal foil and a low water absorption. In addition, according to the present invention, a prepreg, a film with resin, a metal foil with resin, a metal-clad laminate, and a wiring board which are obtained using the resin composition are provided.

The invention claimed is:

1. A resin composition comprising:

a polyphenylene ether compound having a carbon-carbon unsaturated double bond at a terminal;

a maleimide compound (A) having an indane structure in a molecule;

a curing agent that reacts with at least one of the polyphenylene ether compound and the maleimide compound (A); and an inorganic filler, wherein the curing agent includes an N-alkyl bismaleimide compound having a weight average molecular weight of 689 or more, and a content of the curing agent is 5 to 25 parts by mass with respect to 100 parts by mass of a total mass of the polyphenylene ether compound and the maleimide compound (A).

2. The resin composition according to claim 1, wherein the indane structure includes a structure represented by the following Formula (1):

(1)

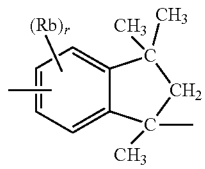

wherein in Formula (1), "Rb" represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a hydroxyl group, or a mercapto group, and r represents 0 to 3.

3. The resin composition according to claim 1, wherein the maleimide compound (A) includes a maleimide compound (A1) represented by the following Formula (2):

(2)

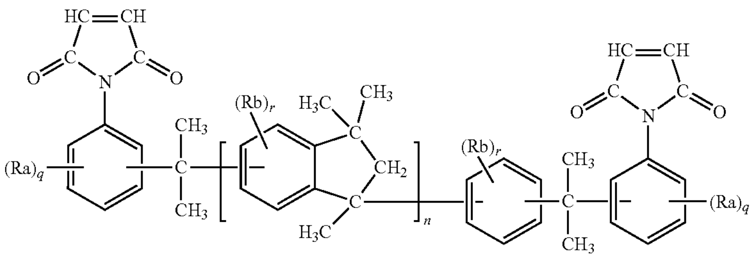

wherein in Formula (2), "Ra" represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group, "Rb" represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group, q represents 0 to 4, r represents 0 to 3, and n represents 0.95 to 10.

4. The resin composition according to claim 1, wherein the maleimide compound (A) further has an arylene structure bonded in meta-orientation in a molecule.

5. The resin composition according to claim 1, wherein the polyphenylene ether compound includes a polyphenylene ether compound having at least one selected from a group represented by the following Formula (3) and a group represented by the following Formula (4) in a molecular terminal:

(3)

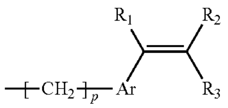

wherein in Formula (3), $R_1$ to $R_3$ each independently represent a hydrogen atom or an alkyl group, Ar represents an arylene group, and p represents 0 to 10, (4)

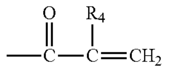

wherein in Formula (4), $R_4$ represents a hydrogen atom or an alkyl group.

6. The resin composition according to claim 1, wherein the inorganic filler includes silica.

7. The resin composition according to claim 1, wherein a content of the maleimide compound (A) is 1 to 90 parts by mass with respect to 100 parts by mass of the total mass of the polyphenylene ether compound and the maleimide compound (A).

8. The resin composition according to claim 1, further comprising a thermoplastic styrenic polymer.

9. The resin composition according to claim 1, further comprising a reaction initiator.

10. The resin composition according to claim 9, wherein the reaction initiator includes at least one selected from a peroxide and an organic azo compound.

11. A prepreg comprising:

the resin composition according to claim 1 or a semi-cured product of the resin composition; and a fibrous base material.

12. A film with resin comprising:

a resin layer containing the resin composition according to claim 1 or a semi-cured product of the resin composition; and a support film.

13. A metal foil with resin comprising:

a resin layer containing the resin composition according to claim 1 or a semi-cured product of the resin composition; and a metal foil.

14. A metal-clad laminate comprising:

an insulating layer containing a cured product of the resin composition according to claim 1; and a metal foil.

15. A wiring board comprising:

an insulating layer containing a cured product of the resin composition according to claim 1; and wiring.

16. A metal-clad laminate comprising:

an insulating layer containing a cured product of the prepreg according to claim 11; and a metal foil.

17. A wiring board comprising:

an insulating layer containing a cured product of the prepreg according to claim 11; and wiring.

* * * * *